US008852844B2

(12) United States Patent
Ogihara et al.

(10) Patent No.: US 8,852,844 B2
(45) Date of Patent: *Oct. 7, 2014

(54) COMPOSITION FOR FORMING SILICON-CONTAINING FILM, SILICON-CONTAINING FILM-FORMED SUBSTRATE AND PATTERNING PROCESS

(75) Inventors: Tsutomu Ogihara, Jyoetsu (JP);
Takafumi Ueda, Jyoetsu (JP);
Toshiharu Yano, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 413 days.

This patent is subject to a terminal disclaimer.

(21) Appl. No.: 12/461,374

(22) Filed: Aug. 10, 2009

(65) Prior Publication Data

US 2010/0086870 A1 Apr. 8, 2010

(30) Foreign Application Priority Data

Oct. 2, 2008 (JP) ................................ 2008-257422

(51) Int. Cl.
*G03F 7/00* (2006.01)
*G03F 7/004* (2006.01)
*C08G 77/06* (2006.01)

(52) U.S. Cl.
USPC .............. 430/270.1; 528/14; 528/15; 528/16; 528/17; 528/18; 528/19; 528/20; 528/21; 528/22; 528/23

(58) Field of Classification Search
USPC ........... 430/270.1; 528/14, 15, 16, 17, 18, 19, 528/20, 21, 22, 23
See application file for complete search history.

(56) References Cited

U.S. PATENT DOCUMENTS

| 5,385,804 | A | 1/1995 | Premlatha et al. |
| 5,632,910 | A | 5/1997 | Nagayama et al. |
| 6,013,416 | A | 1/2000 | Nozaki et al. |
| 6,025,117 | A | 2/2000 | Nakano et al. |
| 6,280,898 | B1 | 8/2001 | Hasegawa et al. |
| 6,329,125 | B2 | 12/2001 | Takechi et al. |
| 6,503,692 | B2 | 1/2003 | Angelopoulos et al. |
| 6,703,183 | B2 | 3/2004 | Nishi et al. |
| 7,202,013 | B2 * | 4/2007 | Ogihara et al. ............. 430/272.1 |
| 7,303,785 | B2 | 12/2007 | Ogihara et al. |
| 7,303,855 | B2 | 12/2007 | Hatakeyama et al. |
| 7,432,035 | B2 | 10/2008 | Maeda et al. |
| 7,875,417 | B2 | 1/2011 | Ogihara et al. |
| 8,029,974 | B2 * | 10/2011 | Ogihara et al. ............. 430/270.1 |
| 2001/0026901 | A1 | 10/2001 | Maeda et al. |
| 2002/0187422 | A1 | 12/2002 | Angelopoulos et al. |
| 2003/0091929 | A1 | 5/2003 | Nishi et al. |
| 2004/0106064 | A1 * | 6/2004 | Choi ........................ 430/270.1 |
| 2004/0247900 | A1 | 12/2004 | Ogihara et al. |
| 2004/0253461 | A1 | 12/2004 | Ogihara et al. |
| 2005/0106499 | A1 | 5/2005 | Harada et al. |
| 2006/0019195 | A1 | 1/2006 | Hatakeyama et al. |
| 2007/0134916 | A1 | 6/2007 | Iwabuchi et al. |
| 2008/0026322 | A1 * | 1/2008 | Ogihara et al. ............. 430/270.1 |
| 2009/0011372 | A1 | 1/2009 | Ogihara et al. |
| 2009/0136869 | A1 | 5/2009 | Ogihara et al. |
| 2010/0086872 | A1 | 4/2010 | Ogihara et al. |

FOREIGN PATENT DOCUMENTS

| EP | 1 375 615 A2 | 1/2004 |
| EP | 1 788 012 A1 | 5/2007 |
| EP | 1 788 433 A2 | 5/2007 |
| EP | 1 845 132 A2 | 10/2007 |
| EP | 1 867 681 A1 | 12/2007 |
| EP | 2 011 829 A1 | 1/2009 |
| EP | 2 063 319 A1 | 5/2009 |
| JP | A-05-291208 | 11/1993 |
| JP | A-06-095385 | 4/1994 |
| JP | A-07-181688 | 7/1995 |
| JP | A-07-183194 | 7/1995 |
| JP | A-08-012626 | 1/1996 |
| JP | A-09-073173 | 3/1997 |
| JP | A-11-060735 | 3/1999 |
| JP | A-2000-159758 | 6/2000 |
| JP | A-2003-084438 | 3/2003 |
| JP | A-2004-153125 | 5/2004 |
| JP | A-2004-157469 | 6/2004 |

(Continued)

OTHER PUBLICATIONS

Sugita et al., "Spin-on-Glass (SOG) for the Trilayer Imaging Process," *Journal of Applied Polymer Science*, vol. 88, pp. 636-640, 2003.
Brinker et al., "Sol-Gel Science: The Physics and Chemistry of Sol-Gel Processing," Academic Press, San Diego, CA, 1990, p. 120.
Oct. 7, 2010 Notice of Allowance issued in U.S. Appl. No. 12/163,350.
Apr. 28, 2010 Office Action issued in Japanese Patent Application No. 2007-245870.
Ito et al., "Synthesis and Preliminary Evaluation of Substituted Poly(Norbornene Sulfones) for 193 NM Lithography," Polm. Mater. Sci. Eng., vol. 77, 1997, pp. 449-450.
Apr. 28, 2010 Office Action issued in Japanese Patent Application No. 2007-303130.

(Continued)

*Primary Examiner* — Amanda C. Walke
(74) *Attorney, Agent, or Firm* — Oliff PLC

(57) ABSTRACT

There is disclosed a thermosetting composition for forming a silicon-containing film to form a silicon-containing film formed in a multilayer resist process used in lithography, including at least (A) a silicon-containing compound obtained by hydrolyzing and condensing a hydrolyzable silicon compound using an acid as a catalyst, (B) a thermal crosslinking accelerator (C) a monovalent or bivalent or more organic acid having 1 to 30 carbon atoms, (D) trivalent or more alcohol and (E) an organic solvent. There can be provided a composition for a silicon-containing film which can form a good pattern in a photoresist film, can form a silicon-containing film for an etching mask having a good dry etching resistance, can give a good storage stability and can be delaminated with a solution used in a delamination process in a multilayer resist process used for lithography, a substrate on which the silicon-containing film is formed, and further a method for forming a pattern.

24 Claims, No Drawings

(56) References Cited

FOREIGN PATENT DOCUMENTS

| | | |
|---|---|---|
| JP | A-2004-191386 | 7/2004 |
| JP | A-2004-349572 | 12/2004 |
| JP | A-2005-015779 | 1/2005 |
| JP | A-2005-128509 | 5/2005 |
| JP | A-2005-146252 | 6/2005 |
| JP | A-2005-520354 | 7/2005 |
| JP | A-2007-163846 | 6/2007 |
| JP | A-2008-19423 | 1/2008 |
| WO | WO 00/01684 A1 | 1/2000 |
| WO | WO 2006/040956 A1 | 4/2006 |

OTHER PUBLICATIONS

Mar. 22, 2011 Notice of Allowance issued in U.S. Appl. No. 12/163,795.
Jan. 29, 2010 Search Report issued in European Patent Application No. 09012327.4.
Jan. 28, 2010 Search Report issued in European Patent Application No. 09012329.0.
Jan. 29, 2010 Office Action issued in European Patent Application No. 09012327.4.

* cited by examiner

COMPOSITION FOR FORMING SILICON-CONTAINING FILM, SILICON-CONTAINING FILM-FORMED SUBSTRATE AND PATTERNING PROCESS

BACKGROUND OF THE INVENTION

1. Field of the Invention

The present invention relates to a composition for forming a silicon-containing film used in a multilayer resist process used for a microfabrication in a process for producing semiconductor devices, a silicon-containing film-formed substrate and a patterning process by use thereof.

2. Description of the Related Art

With high integration and speeding up of LSI, miniaturization of pattern sizes has progressed rapidly. Lithography technology has accomplished the formation of fine patterns in response to this miniaturization by shortening a wavelength of a light source and appropriately selecting a resist composition corresponding thereto. A positive resist composition used in a monolayer has been a basis thereof. In this monolayer positive photoresist composition, an exposed portion is dissolved to form the pattern by giving a skeleton possessing etching resistance to dry etching with chlorine-based or fluorine-based gas plasma to a resist resin and giving a resist mechanism to dissolve the exposed potion, and the processing substrate onto which the resist composition has been applied is dry-etched using a remaining resist pattern as an etching mask.

However, when a photoresist film to be used is directly miniaturized with keeping a film thickness, i.e., a pattern width is further reduced, a resolution performance of the photoresist film is diminished. When the pattern of the photoresist film is developed by a developer, a so-called aspect ratio is excessively increased. As a result, a pattern collapse occurs. Thus, with the miniaturization, the photoresist film thickness has been thinned.

Meanwhile, for processing the processing substrate, a method for processing the processing substrate by the dry etching using the photoresist film in which the pattern has been formed as the etching mask is typically employed, but actually no dry etching method capable of taking a perfect etching selectivity between the photoresist film and the processing substrate is available. Thus, the resist film is damaged during processing the processing substrate; the resist film collapses, and the resist pattern can not be precisely transferred to the processing substrate. Accordingly, with the miniaturization of: the pattern, higher dry etching resistance has been required for the resist composition.

Due to shortening the wavelength in an exposure wavelength, the resin having small light-absorption in the exposure wavelength is required for the resin used for the resist composition. Thus, for the change from i-beam to KrF and ArF, the resins have also changed from novolak resins to polyhydroxystyrene and the resins having an aliphatic polycyclic skeleton. However, actually an etching speed in the above dry etching condition has already become fast, and the recent photoresist composition having the high resolution tends to rather reduce the etching resistance.

From this, the processing substrate must be processed by dry etching using the photoresist film which is thinner and less etching resistant. It is an urgent need to assure materials and processes in this processing process.

As one of the methods for solving such problems, a multilayer resist process is available. In this method, a resist intermediate film whose etching selectivity is different from that of the photoresist film, i.e., a resist upper layer film is disposed between the resist upper layer film and the processing substrate, the pattern is obtained in the resist upper layer, subsequently the pattern is transferred onto the resist intermediate film by dry etching using the resulting pattern in the resist upper layer as the dry etching mask, and further the pattern is transferred onto the processing substrate by the dry etching using the resulting pattern in the intermediate film as the dry etching mask.

In a bilayer resist method which is one of the multilayer resist processes, for example, silicon-containing resin is used for the resist upper layer composition, and the novolak resin is used as the resist intermediate film (e.g., Japanese Patent Laid-Open (kokai) No. H6-95385). The silicon-containing resin exhibits the good etching resistance to the reactive dry etching with oxygen plasma, but is easily removed by the etching when fluorine-based gas plasma is used. Meanwhile, the novolak resin is easily removed by the etching in the reactive dry etching with the oxygen plasma, but exhibits the good etching resistance to the dry etching with the fluorine-based gas plasma and the chloride-based gas plasma. Thus, a novolak resin film is formed as the resist intermediate film on the processing substrate, and a resist upper layer film using the silicon-containing resin is formed thereon. Subsequently, the pattern is formed in the silicon-containing resin film by post treatments such as exposure to energy beam and development. Using this as the dry etching mask, the portion of the novolak resin where the resist pattern has been removed is removed by the reactive dry etching with the oxygen plasma to transfer the pattern in the novolak film. Using this pattern transferred to the novolak resin as the dry etching mask, the pattern can be transferred to the processing substrate using the etching with the fluorine-based gas plasma or the chloride-based gas plasma.

In such a pattern transfer by the dry etching, when the etching resistance of the etching mask is sufficient, the transferred pattern having a relatively good shape is obtained. Thus, a pattern collapse caused by friction by a developer upon resist development hardly occurs, and the pattern having a relatively high aspect ratio can be obtained. Therefore, for example, when the resist film using the novolak resin has the thickness corresponding to the film thickness of the intermediate film, even in the fine pattern which could not be formed directly because of the pattern collapse upon development due to the aspect ratio, according to the above bilayer resist method, the novolak resin pattern having the sufficient thickness as the dry etching mask for the processing substrate is obtained.

Furthermore, as the multilayer resist process, a trilayer resist method which can be performed using the common resist composition used in the monolayer resist method is available. For example, an organic film by novolak and the like is formed as the resist lower layer film on the processing substrate, the silicon-containing film is formed as the resist intermediate film thereon, and an ordinary organic photoresist film is formed as the resist upper layer film thereon. The organic photoresist film exhibits the better etching resistance than the silicon-containing resist intermediate film in the dry etching with the fluorine-based gas plasma. Thus, the resist pattern is transferred to the silicon-containing film as the resist intermediate film using the dry etching with the fluorine-based gas plasma. According to this method, even when the resist composition in which it is difficult to form the pattern having the sufficient film thickness for directly processing the processing substrate or the resist composition having the insufficient dry etching resistance to process the substrate is used, if the pattern can be transferred to the silicon-containing film, like the bilayer resist method, it is possible to obtain the pattern of the organic film having the dry etching resistance enough to be processed.

As the silicon-containing resist intermediate film used in the above trilayer resist method, silicon-containing inorganic films by CVD such as $SiO_2$ films (e.g., Japanese Patent Laid-Open (kokai) No. H7-183194) and SiON films (e.g., Japanese Patent Laid-Open (kokai) No. H7-181688); SOG (spin on glass) (e.g., Japanese Patent Laid-Open (kokai) No. H5-291208, J. Appl. Polym. Sci., Vol. 88, 636-640 (2003)) and crosslinking silsesquioxane films (e.g., Japanese translation of PCT international application No. 2005-520354) as the films obtained by spin coating are used, and polysilane films (e.g., Japanese Patent Laid-Open (kokai) No. H11-60735) is also believed to be used. Among them, the $SiO_2$ films and the SiON films have the high performance as the dry etching mask when the organic film as the resist lower layer film is dry-etched, but a particular apparatus is required for forming the film. On the contrary, the SOG films, crosslinkable silsesquioxane films and the polysilane films can be formed by the spin coating and heating and are believed to have a high process efficiency.

An application range of the multilayer resist process is not limited to an attempt to enhance a resolution limit of the resist film. As a via first method which is one of the methods for processing the substrate, when a processing intermediate substrate has a large bump, if the pattern is formed by a single resist film, the resist film thickness has a large difference. Thus, the focus can not be adjusted precisely upon resist exposure. In such a case, the bump is buried with a sacrificial layer to flatten, then the resist film is formed thereon and the resist pattern is formed. In this case, the multilayer resist process is inevitably employed (e.g., Japanese Patent Laid-Open (kokai) No. 2004-349572).

There are several problems in the silicon-containing film conventionally used in such a multilayer resist process. For example, when the resist pattern is formed by photolithography, it is well-known that exposure light is reflected on the substrate and interferes with incident light to cause a so-called stationary wave. In order to obtain the fine pattern having no edge roughness in the photoresist film, it is necessary to insert an antireflection film. In particular, reflection control is an essential condition in a state-of-the-art high NA exposure condition.

Thus, for controlling the reflection, it is necessary to insert an organic antireflection film between the photoresist film formed on the silicon-containing film and silicon-containing film in the multilayer resist process, particularly in the process in which the silicon-containing film is formed as the resist intermediate film by CVD. However, when the organic antireflection film is inserted, it becomes necessary to form the pattern in the organic antireflection film using the photoresist film as the dry etching mask. Upon dry etching, the organic antireflection film is processed by dry etching using the photoresist film as the mask, and subsequently the silicon-containing film is processed. Thus, a load of the dry etching for processing the organic antireflection film is added to the upper layer photoresist film. In particular, the film thickness is thinned in the-state-of-the-art photoresist film, and this dry etching load can not be missed out. Thus, the trilayer resist method in which a light absorbable silicon-containing film which generates no etching load as the above is applied as the resist intermediate film has been noticed.

As such a light absorbable silicon-containing film utilized as the resist intermediate film, the light absorbable silicon-containing film of a spin coating type is known. For example, a technique for giving an aromatic structure as a light absorbable structure has been disclosed (Japanese Patent Laid-Open (kokai) No. 2005-15779).

However, an aromatic ring structure which absorbs the light efficiently acts to reduce the dry etching speed in the dry etching processing with the fluorine-based gas plasma, and thus is disadvantageous for the dry etching of the resist intermediate film without adding the load to the photoresist film. Thus, it is not preferable to add such a light absorbable substituent in a large amount, and it is necessary to minimize the amount of introduction thereof.

Furthermore, the dry etching speed in the reactive dry etching with the oxygen gas plasma generally used when the resist lower layer film is processed using the resist intermediate film as the dry etching mask is preferably smaller for enhancing an etching selection ratio of the resist intermediate film and the resist lower layer film. In order to obtain such a dry etching property, the resist intermediate film in which a content of silicon having the high reactivity to fluorine-based etching gas is high as possible is desired. As described above, it can be said that the film containing the high content of silicon having the high reactivity to fluorine-based gas is preferable as a requirement from processing conditions of the upper layer photoresist film and the lower layer organic film.

In an actual composition for forming the silicon-containing intermediate film of the spin coating type, an organic substituent is contained so that a silicon-containing compound can be dissolved in an organic solvent. In the lithography using KrF excimer laser, among the conventionally known silicon-containing films as the resist intermediate films, the composition which forms the SOG film has been disclosed in J. Appl. Polym. Sci., Vol. 88, 636-640 (2003).

However, since there is no description for the light absorbable group in this composition, it is predicted that there is no antireflection function in the silicon-containing film obtained from this composition.

Thus, there is a possibility that the highly fine resist pattern can not be obtained because the reflection upon exposure can not be avoided in the lithography using a state-of-the-art high NA exposing machine.

As described above, the good dry etching property and realization of the highly fine resist pattern profile between the resist upper layer film and the resist lower layer film are required for the silicon-containing film as the resist intermediate film used in the multilayer resist process. A storage stability of the composition for forming the silicon-containing compound is particularly problematic in the composition for forming the silicon-containing film for forming the intermediate film containing the high content of silicon. In the composition for forming the silicon-containing film, silanol groups present in the silicon-containing compound in the composition are condensed to change a molecular weight of the composition for forming the silicon-containing film in some cases.

Generally when water is allowed to act upon a hydrolyzable silicon compound (monomer) in the presence of an acid catalyst, a hydrolyzable substituent bound to a silicon atom undergoes the hydrolysis to form a silanol group. This silanol group is condensed with another silanol group or an unreacted hydrolyzable group to form a siloxane bond. And this reaction is continuously repeated to form a so-called oligomer, polymer and in some cases a silicon-containing compound referred to as sol. At that time, the silanol groups derived from the monomers, oligomers and polymers produced by the hydrolytic reaction in the system are condensed sequentially from the most reactive one, the silanol groups in the monomer, the oligomer and the polymer are consumed and the silicon-containing compound is formed. This condensation reaction progresses endlessly and sometimes progresses until a silicon-containing compound solution is finally gelled. In such a case, change of the film thickness and change of lithography performance are observed. In particular since the change of the lithography performance is sensitive, even though the increase of the film thickness and the change of a molecular weight by condensing the silanol groups in the molecule are not observed, the change of the highly fine pattern shape is observed.

Conventionally, it has been described in C. J. Brinker and G. W. Scherer, "Sol-Gel Science: The Physics and Chemistry of Sol-Gel Processing", Academic Press, San Diego (1990) that when such a highly reactive silanol group is kept in an acidic state, the compound can be relatively stabilized. Furthermore, adding the water to enhance the storage stability has been disclosed in J. Appl. Polym. Sci., Vol. 88, 636-640 (2003) and Japanese Patent Laid-Open (kokai) No. 2004-157469 and Japanese Patent Laid-Open (kokai) No. 2004-191386.

However, the silicon-containing compound in the composition for forming the silicon-containing film produced by the method described above, even though such a procedure is given, actually the condensation reaction of the silanol groups can not be stopped completely, the silicon-containing compound gradually changes with time, and nature of the silicon-containing film obtained from the changed composition for forming the silicon-containing film also changes. Thus, the compound must have been stored in a refrigerator or a freezer until just before the use, its temperature must have been backed to a use temperature (usually 23° C.) upon use, and the composition must have been used up promptly.

Furthermore, in the actual process for producing the semiconductor devices, there is the case where a failure occurs on an applied film formed on the substrate and the film must be reprocessed. The conventional SOG film has almost the same composition as in $SiO_2$. Thus, dry delamination with hydrofluoric acid or fluorine-based gas is used for delaminating this film, but this delamination method largely damages the substrate.

For this problem, the composition for forming the silicon-containing film is required where a wet delamination using a sulfuric acid/hydrogen peroxide mixture or an ammonia/hydrogen peroxide mixture as generally used for the conventional process for producing the semiconductor devices can be performed.

SUMMARY OF THE INVENTION

The present invention has been made in the light of the above circumstance, and it is an object of the present invention to provide a composition for forming a silicon-containing film, in a multilayer resist process used for lithography, (1) where a photoresist film as a resist upper layer film is formed on a silicon-containing film formed on an organic film as a resist lower layer film and subsequently when a resist film pattern is formed, a good resist film pattern can be formed even under a high NA exposure condition, (2) which has a good dry etching property between the photoresist film and the organic film, (3) whose storage stability is good, and (4) where not only conventional hydrofluoric acid delamination and dry delamination is available but also the delamination using a solution of sulfuric acid/hydrogen peroxide or ammonia/hydrogen peroxide can be performed; a substrate on which the silicon-containing film has been formed from this composition for forming the silicon-containing film, and further a patterning process by use thereof.

For solving the above problems, the present invention provides a thermosetting composition for forming a silicon-containing film to form a silicon-containing film formed in a multilayer resist process used for lithography, characterized by comprising at least (A) a silicon-containing compound obtained by hydrolyzing and condensing a hydrolyzable silicon compound using an acid as a catalyst;

(B) one or two or more thermal crosslinking accelerators represented by the following general formula (1) or (2):

$$L_a H_b X \quad (1),$$

wherein L represents lithium, sodium, potassium, rubidium or cesium, X represents a hydroxyl group or a monovalent or bivalent or more organic acid group having 1 to 30 carbon atoms, a represents an integer of 1 or more, b represents an integer of 0 or 1 or more, and a+b is a valence of the hydroxyl group or the organic acid group;

$$M_{a'} H_{b'} A \quad (2),$$

wherein M represents sulfonium, iodonium or ammonium, A represents a hydroxyl group or a monovalent or bivalent or more organic acid group having 1 to 30 carbon atoms or non-nucleophilic counter ion, a' represents an integer of 1 or more, b' represents an integer of 0 or 1 or more, and a'+b' is a valence of the hydroxyl group, the organic acid group or the non-nucleophilic counter ion;

(C) a monovalent or bivalent or more organic acid having 1 to 30 carbon atoms;

(D) trivalent or more alcohol; and (E) an organic solvent.

As described above, in the multilayer resist process used for the lithography, by the use of the thermosetting composition for forming the silicon-containing film of the present invention, (1) the silicon-containing film capable of forming the good resist film pattern under any of dry and liquid-immersed high NA exposure condition is obtained, (2) the silicon-containing film is obtained which gives a sufficient etching ratio as a dry etching mask between the upper layer photoresist film and the lower layer organic film, (3) the composition for forming the silicon-containing film is obtained whose performance is not changed even if a lithography performance is kept for a long period of time and whose storage stability is good, and (4) the silicon-containing film can be obtained which can be delaminated by a wet method using sulfuric acid/hydrogen peroxide or ammonia/hydrogen peroxide generally used in the conventional process for producing the semiconductor devices.

It is preferable that the silicon-containing compound includes the silicon-containing compound which can be obtained by hydrolyzing and condensing the hydrolyzable silicon compound using one or more compounds selected from inorganic acids and sulfonic acid derivatives as an acid catalyst to yield a reaction mixture and substantially removing the acid catalyst from the reaction mixture.

As described above, the storage stability can be further enhanced by hydrolyzing and condensing the hydrolyzable silicon compound using one or more compounds selected from inorganic acids and sulfonic acid derivatives as the acid catalyst to yield the reaction mixture and substantially removing the acid catalyst from the reaction mixture.

It is also preferable that M in the general formula (2) is tertiary sulfonium, secondary iodonium or quaternary ammonium.

As described above, when the component (B) where M in the general formula (2) is tertiary sulfonium, secondary iodonium or quaternary ammonium is used to form the silicon-containing film, the silicon-containing film in which the crosslinking has proceeded can be provided. Thus, migration of an active component in the photoresist film formed on the silicon-containing film to the silicon-containing film is inhibited and nearly the same lithography performance as the performance of the ordinary organic antireflection film can be obtained.

It is also preferable that M in the general formula (2) is photodegradable.

M in the general formula (2) is photodegradable, thereby being capable of preventing deterioration of the resist film pattern profile upon exposure.

It is also preferable that the hydrolytic silicon compound has a light absorbable group.

As described above, the hydrolyzable silicon compound has the light absorbable group, thereby the silicon-containing film has a photo absorbability, the reflection can be inhibited even under the high NA exposure condition and the better resist film pattern can be formed.

It is also preferable that the thermosetting composition for forming the silicon-containing film further comprises water.

As described above, the water is added to the thermosetting composition for forming the silicon-containing film, thereby the silanol group in the silicon-containing compound can be activated and the denser film can be obtained by thermal cure reaction. By the use of such a dense film, it is possible to make the lithography performance of the photoresist film formed on the silicon-containing film the same as or higher than the lithography performance of the photoresist film formed on the organic antireflection film when the general organic antireflection film is used.

It is also preferable that the thermosetting composition for forming the silicon-containing film further comprises a photo acid generator.

As described above, the thermosetting composition for forming the silicon-containing film further comprises the photo acid generator, thereby the deterioration of the resist film pattern profile can be prevented by generating the acid in the silicon-containing film when the resist film pattern is formed.

It is also preferable that the thermosetting composition for forming the silicon-containing film further comprises monovalent or bivalent or more alcohol having cyclic ether as a substituent.

As described above, when monovalent or bivalent or more alcohol having cyclic ether as the substituent is added as a stabilizer to the thermosetting composition for forming the silicon-containing film, the condensation around the room temperature is inhibited, and the storage stability of the thermosetting composition for forming the silicon-containing film can be enhanced exponentially.

The present invention provides a substrate comprising an organic film formed on a processing substrate, a silicon-containing film formed on the organic film and formed from the thermosetting composition for forming the silicon-containing film of the present invention and a photoresist film formed on the silicon-containing film. The present invention also provides a substrate where an organic antireflection film has been formed between the silicon-containing film and the photoresist film.

As described above, when the pattern is formed on the substrate by the lithography using the substrate on which three layers of the organic film, the silicon-containing film formed from the thermosetting composition for forming the silicon-containing film of the present invention and the photoresist film have been formed, the fine pattern with high accuracy can be formed on the substrate. By forming the organic antireflection film between the silicon-containing film and the photoresist film, the better resist film pattern is obtained.

The present invention provides the substrate where the photoresist film is formed using a chemically amplified type resist composition. As described above, the chemically amplified type resist composition can be used as the photoresist film.

The present invention provides the substrate where the organic film has an aromatic skeleton. As described above, by the use of the organic film having the aromatic skeleton, the organic film not only has an antireflection effect in a lithography process but also has the sufficient etching resistance when the substrate is processed by the etching, and the good etching processing becomes possible.

The present invention provides a patterning process on a substrate by lithography, comprising forming a silicon-containing film formed from the thermosetting composition for forming the silicon-containing film on an organic film formed on the processing substrate, forming a photoresist film on the silicon-containing film using a chemically amplified type resist composition and subsequently exposing a pattern circuit region in the photoresist film, developing the photoresist film by a developer to form a resist film pattern in the photoresist film, dry-etching the silicon-containing film using the resulting resist film pattern as an etching mask, etching the organic film using the resulting silicon-containing film pattern as an etching mask, and etching the substrate using the organic film in which the pattern has been formed as an etching mask to form the pattern on the substrate (claim 13).

The present invention provides a patterning process on a substrate by lithography, comprising forming a silicon-containing film formed from the thermosetting composition for forming the silicon-containing film on an organic film formed on the processing substrate, forming an organic antireflection film on the silicon-containing film, forming a photoresist film on the organic antireflection film using a chemically amplified type resist composition and subsequently exposing a pattern circuit region in the photoresist film, developing the photoresist film by a developer to form a resist film pattern in the photoresist film, dry-etching the organic antireflection film and the silicon-containing film using the resulting resist film pattern as an etching mask, etching the organic film using the resulting silicon-containing film pattern as an etching mask, and etching the substrate using the organic film in which the pattern has been formed as an etching mask to form the pattern on the substrate.

By the use of the method for forming the pattern using such a trilayer resist method, the fine pattern with high accuracy can be formed on the substrate.

It is also preferable that the lithography is carried out using the light having a wavelength of 300 nm or less in the patterning process.

In the present invention, when the pattern is formed by the lithography using the light having a wavelength of 300 nm or less, particularly ArF excimer laser, the fine pattern can be formed with high accuracy.

As described above, by the use of the thermosetting composition for forming the silicon-containing film of the present invention, (1) the silicon-containing film in which the good resist film pattern can be formed under any of the dry and liquid-immersed high NA exposure condition is obtained, (2) the silicon-containing film is obtained which gives the etching selection ratio as the dry etching mask between the upper layer photoresist film and the lower layer organic film, (3) the composition for forming the silicon-containing film is obtained whose performance is not changed and whose storage stability is good even when the lithography performance is stored for a long period of time, and (4) the silicon-containing film can be formed which can be delaminated by the wet method using sulfuric acid/hydrogen peroxide or ammonia/hydrogen peroxide generally used in the conventional process for producing the semiconductor devices.

DETAILED DESCRIPTION OF THE PREFERRED EMBODIMENTS

The present invention will be described more specifically below.

As mentioned above, it has been necessary for the silicon-containing film conventionally used in the multilayer resist process that the good resist film pattern can be formed even under the high NA exposure condition, the sufficient etching selection ratio is obtained between the upper layer photoresist film and the lower layer organic film, the storage stability is good and the delamination by the wet method is possible.

Thus, the present inventor studied extensively on the lithography property and the stability of the composition for forming the silicon-containing film which is formed in the multilayer resist process used for the lithography, and has found that the silicon-containing film where the good resist film pattern can be formed even under the high NA exposure condition, the sufficient etching selection ratio is obtained between the upper layer photoresist film and the lower layer organic film, the storage stability is good and the delamination by the wet method is possible can be formed by adding (B) one or two or more thermal crosslinking accelerators represented by the following general formula (1) or (2):

$$L_a H_b X \qquad (1),$$

wherein L represents lithium, sodium, potassium rubidium or cesium, X represents a hydroxyl group or a monovalent or bivalent or more organic acid group having 1 to 30 carbon atoms, a represents an integer of 1 or more, b represents an integer of 0 or 1 or more, and a+b is a valence of the hydroxyl group or the organic acid group;

$$M_{a'} H_{b'} A \qquad (2),$$

wherein M represents sulfonium, iodonium or ammonium, A represents a hydroxyl group or a monovalent or bivalent or more organic acid group having 1 to 30 carbon atoms or non-nucleophilic counter ion, a' represents an integer of 1 or more, b' represents an integer of 0 or 1 or more, and a'+b' is a valence of the hydroxyl group, the organic acid group or the non-nucleophilic counter ion;

(C) a monovalent or bivalent or more organic acid having 1 to 30 carbon atoms;

(D) trivalent or more alcohol; and (E) an organic solvent to (A) a silicon-containing compound obtained by hydrolyzing and condensing a hydrolyzable silicon compound using an acid as a catalyst.

That is, the present inventor has found that the migration of the active component in the photoresist film to the silicon-containing film is inhibited, almost the same lithography property as in the ordinary organic antireflection film can be obtained and the good resist film pattern is obtained because the film can be cured efficiently by changing pH around the silanol group from pH at which the condensation reaction is inhibited to a pH region (around pH 3, described in C. J. Brinker and G. W. Scherer, "Sol-Gel Science: The Physics and Chemistry of Sol-Gel Processing", Academic Press, San Diego, 1990) at which the condensation reaction-occurs by the action of the added component (B) when the composition is applied and cured with heating and the film in which the crosslinking has further proceeded compared with the conventional cured film when the film is heated and cured at the same temperature as the conventional one can be provided. It has been also found that when the component (C), i.e., the monovalent or bivalent or more organic acid having 1 to 30 carbon atoms is used, the condensation reaction is inhibited at room temperature and the storage stability is enhanced.

As described above, the composition which is stable at room temperature and can be cured efficiently when heated and cured by combining (C) the monovalent or bivalent or more organic acid having 1 to 30 carbon atoms with (B) the thermal crosslinking accelerator has been found. It has been found that by this the composition for forming the silicon-containing film can be obtained which forms the silicon-containing film having the same stability as in the conventional organic antireflection film. It has been also found that the silicon-containing film can be formed which can take the sufficient etching selection ratio between the photoresist film as the resist upper layer film and the organic film as the resist lower layer film when the thermosetting composition for forming the silicon-containing film of the present invention is used. Furthermore, when (D) trivalent or more alcohol is added, dehydration and condensation occur between silanol and alcohol, and the product is incorporated into the film. This carbon moiety is easily attacked by a delaminating agent. It has been found that this moiety is degraded, thereby easily degrading the coated film to enable the delamination by the wet method.

The silicon-containing compound compounded in the thermosetting composition for forming the silicon-containing film of the present invention is obtained by hydrolyzing and condensing the hydrolyzable silicon compound in the presence of the acid as the catalyst. The following method can be exemplified as the preferable method for producing the silicon-containing compound, which is not however limited thereto.

A starting material for forming the component (A) silicon-containing compound is one obtained by hydrolyzing and condensing one or a mixture of two or more selected from hydrolyzable silicon compounds (monomers) which can be represented by the following general formula (3):

$$R^1{}_{m1} R^2{}_{m2} R^3{}_{m3} Si(OR)_{(4-m1-m2-m3)} \qquad (3),$$

wherein R represents an alkyl group having 1 to 3 carbon atoms, $R^1$, $R^2$ and $R^3$ may be the same or different one another and represent a hydrogen atom or a monovalent organic group having 1 to 30 carbon atoms, m1, m2 and m3 are 0 or 1 and m1+m2+m3 is 0 to 3 preferably 0 or 1.

Here the organic group means the group containing carbon, and may further contain hydrogen, nitrogen, oxygen, sulfur and silicon. The organic groups of $R^1$, $R^2$ and $R^3$ can include unsubstituted monovalent hydrocarbon groups such as straight, branched and cyclic alkyl, alkenyl, alkynyl, aryl and aralkyl groups, and groups obtained by substituting one or more hydrogen atoms of these groups with epoxy, alkoxy and hydroxy, groups represented by the general formula (4) described later, e.g., the groups mediated by —O—, —CO—, —OCO—, —COO—, and —OCOO—, and organic groups containing a silicon-silicon bond. In order to obtain the better resist film pattern, it is preferable to contain the monomer containing a light absorbable group in $R^1$, $R^2$ or $R^3$.

Preferable $R^1$, $R^2$ and $R^3$ in the monomer represented by the general formula (3) include hydrogen atoms, alkyl groups such as methyl, ethyl, n-propyl, iso-propyl, n-butyl, iso-butyl, sec-butyl, t-butyl, n-pentyl, 2-ethylbutyl, 3-ethylbutyl, 2,2-diethylpropyl, cyclopentyl, n-hexyl and cyclohexyl, alkenyl groups such as vinyl and allyl, alkynyl groups such as ethynyl, and further as the light absorbable groups, aryl groups such as phenyl and tolyl, and aralkyl groups such as benzyl and phenethyl are included.

For example, tetramethoxysilane, tetraethoxysilane, tetra-n-propoxysilane and tetra-iso-propoxysilane as tetra-alkoxysilane where m1=0, m2=0 and m3=0 can be exemplified as the monomer. Tetramethoxysilane and tetraethoxysilane are preferable.

For example, as tri-alkoxysilane where m1=1, m2=0 and m3=0, trimethoxysilane, triethoxysilane, tri-n-propoxysilane, tri-iso-propoxysilane, methyltrimethoxysilane, methyltriethoxysilane, methyl-tri-n-propoxysilane, methyl-tri-iso-propoxysilane, ethyltrimethoxysilane, ethyltriethoxysilane, ethyl-tri-n-propoxysilane, ethyl-tri-iso-propoxysilane, vinyltrimethoxysilane, vinyltriethoxysilane, vinyl-tri-n-propoxysilane, vinyl-tri-iso-propoxysilane, n-propyltrimethoxysilane, n-propyltriethoxysilane, n-propyl-tri-n-propoxysilane, n-propyl-tri-iso-propoxysilane, i-propyltrimethoxysilane, i-propyltriethoxysilane, i-propyl-tri-n-propoxysilane, i-propyl-tri-iso-propoxysilane, n-butyltrimethoxysilane, n-butyltriethoxysilane, n-butyl-tri-n-propoxysilane, n-butyl-tri-iso-propoxysilane, sec-butyltrimethoxysilane, sec-butyltriethoxysilane, sec-butyl-tri-n-propoxysilane, sec-butyl-tri-iso-propoxysilane, t-butyltrimethoxysilane, t-butyltriethoxysilane, t-butyl-tri-n-propoxysilane, t-butyl-tri-iso-propoxysilane, cyclopropyltrimethoxysilane, cyclopropyltriethoxysilane, cyclopropyl-tri-n-propoxysilane, cyclopropyl-tri-iso-propoxysilane, cyclobutyltrimethoxysilane, cyclobutyltriethoxysilane, cyclobutyl-tri-n-propoxysilane, cyclobutyl-tri-iso-propoxysilane, cyclopentyltrimethoxysilane, cyclopentyltriethoxysilane, cyclopentyl-tri-n-propoxysilane, cyclopentyl-tri-iso-propoxysilane, cyclohexyltrimethoxysilane, cyclohexyltriethoxysilane, cyclohexyl-tri-n-propoxysilane, cyclohexyl-tri-iso-propoxysilane, cyclohexenyltrimethoxysilane, cyclohexenyltriethoxysilane, cyclohexenyl-tri-n-propoxysilane, cyclohexenyl-tri-iso-propoxysilane, cyclohexenylethyltrimethoxysilane, cyclohexenylethyltriethoxysilane, cyclohexenylethyl-tri-n-propoxysilane, cyclohexenylethyl-tri-iso-propoxysilane, cyclooctanyltrimethoxysilane, cyclooctanyltriethoxysilane, cyclooctanyl-tri-n-propoxysilane, cyclooctanyl-tri-iso-propoxysilane, cyclopentadienylpropyltrimethoxysilane, cyclopentadienylpropyltriethoxysilane, cyclopentadienylpropyl-tri-n-propoxysilane, cyclopentadienylpropyl-tri-iso-propoxysilane, bicycloheptenyltrimethoxysilane, bicycloheptenyltriethoxysilane, bicycloheptenyl-tri-n-propoxysilane, bicycloheptenyl-tri-iso-propoxysilane, bicycloheptyltrimethoxysilane, bicycloheptyltriethoxysilane, bicycloheptyl-tri-n-propoxysilane, bicycloheptyl-tri-iso-propoxysilane, adamantyltrimethoxysilane, adamantyltriethoxysilane, adamantyl-tri-n-propoxysilane and adamantyl-tri-iso-propoxysilane can be exemplified. As the light absorbable monomers, phenyltrimethoxysilane, phenyltriethoxysilane, phenyl-tri-n-propoxysilane, phenyl-tri-iso-propoxysilane, benzyltrimethoxysilane, benzyltriethoxysilane, benzyl-tri-n-propoxysilane, benzyl-tri-iso-propoxysilane, tolyltrimethoxysilane, tolyltriethoxysilane, tolyl-tri-n-propoxysilane, tolyl-tri-iso-propoxysilane, phenethyltrimethoxysilane, phenethyltriethoxysilane, phenethyl-tri-n-propoxysilane, phenethyl-tri-iso-propoxysilane, naphthyltrimethoxysilane, naphthyltriethoxysilane, naphthyl-tri-n-propoxysilane and naphthyl-tri-iso-propoxysilane can be exemplified.

Preferable are methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, iso-propyltrimethoxysilane, iso-propyltriethoxysilane, n-butyltrimethoxysilane, n-butyltriethoxysilane, iso-butyltrimethoxysilane, iso-butyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane and phenethyltriethoxysilane.

For example, as dialkoxysilane where m1=1, m2=1 and m3=0, dimethyldimethoxysilane, dimethyldiethoxysilane, methylethyldimethoxysilane, methylethyldiethoxysilane, dimethyl-di-n-propoxysilane, dimethyl-di-iso-propoxysilane, diethyldimethoxysilane, diethyldiethoxysilane, diethyl-di-n-propoxysilane, diethyl-di-iso-propoxysilane, di-n-propyldimethoxysilane, di-n-propyldiethoxysilane, di-n-propyl-di-n-propoxysilane, di-n-propyl-di-iso-n-propoxysilane, di-iso-propyldimethoxysilane, di-iso-propyldiethoxysilane, di-iso-propyl-di-n-propoxysilane, di-iso-propyl-di-iso-propoxysilane, di-n-butyldimethoxysilane, di-n-butyldiethoxysilane, di-n-butyl-di-n-propoxysilane, di-n-butyl-di-iso-propoxysilane, di-sec-butyldimethoxysilane, di-sec-butyldiethoxysilane, di-sec-butyl-di-n-propoxysilane, di-sec-butyl-di-iso-propoxysilane, di-t-butyldimethoxysilane, di-t-butyldiethoxysilane, di-t-butyl-di-n-propoxysilane, di-t-butyl-di-iso-propoxysilane, di-cyclopropyldimethoxysilane, di-cyclopropyldiethoxysilane, di-cyclopropyl-di-n-propoxysilane, di-cyclopropyl-di-iso-propoxysilane, di-cyclobutyldimethoxysilane, di-cyclobutyldiethoxysilane, di-cyclobutyl-di-n-propoxysilane, di-cyclobutyl-di-iso-propoxysilane, di-cyclopentyldimethoxysilane, di-cyclopentyldiethoxysilane, di-cyclopentyl-di-n-propoxysilane, di-cyclopentyl-di-iso-propoxysilane, di-cyclohexyldimethoxysilane, di-cyclohexyldiethoxysilane, di-cyclohexyl-di-n-propoxysilane, di-cyclohexyl-di-iso-propoxysilane, di-cyclohexenyldimethoxysilane, di-cyclohexenyldiethoxysilane, di-cyclohexenyl-di-n-propoxysilane, di-cyclohexenyl-di-iso-propoxysilane, di-cyclohexenylethyldimethoxysilane, di-cyclohexenylethyldiethoxysilane, di-cyclohexenylethyl-di-n-propoxysilane, di-cyclohexenylethyl-di-iso-propoxysilane, di-cyclooctanyldimethoxysilane, di-cyclooctanyldiethoxysilane, di-cyclooctanyl-di-n-propoxysilane, di-cyclooctanyl-di-iso-propoxysilane, di-cyclopentadienylpropyldimethoxysilane, di-cyclopentadienylpropyldiethoxysilane, di-cyclopentadienylpropyl-di-n-propoxysilane, di-cyclopentadienylpropyl-di-iso-propoxysilane, bis-bicycloheptenyldimethoxysilane, bis-bicycloheptenyldiethoxysilane, bis-bicycloheptenyl-di-n-propoxysilane, bis-bicycloheptenyl-di-iso-propoxysilane, bis-bicycloheptyldimethoxysilane, bis-bicycloheptyldiethoxysilane, bis-bicycloheptyl-di-n-propoxysilane, bis-bicycloheptyl-di-iso-propoxysilane, bis-adamantyldimethoxysilane, bis-adamantyldiethoxysilane, bis-adamantyl-di-n-propoxysilane and bis-adamantyl-di-iso-propoxysilane can be exemplified. As the light absorbable monomers, diphenyldimethoxysilane, diphenyl-di-ethoxysilane, methylphenyldimethoxysilane, methylphenyldiethoxysilane, diphenyl-di-n-propoxysilane and diphenyl-di-iso-propoxysilane can be exemplified.

Preferably dimethyldimethoxysilane, dimethyldiethoxysilane, diethyldimethoxysilane, diethyldiethoxysilane, methylethyldimethoxysilane, methylethyldiethoxysilane, di-n-propyl-di-methoxysilane, di-n-butyl-di-methoxysilane, methylphenyldimethoxysilane and methylphenyldiethoxysilane can be exemplified.

For example, as monoalkoxysilane where m1=1, m2=1 and m3=1, trimethylmethoxysilane, trimethylethoxysilane, dimethylethylmethoxysilane and dimethylethylethoxysilane can be exemplified. As the light absorbable monomers, dimethylphenylmethoxysilane, dimethylphenylethoxysilane, dimethylbenzylmethoxysilane, dimethylbenzylethoxysilane, dimethylphenethylmethoxysilane and dimethylphenethylethoxysilane can be exemplified.

Preferably trimethylmethoxysilane, dimethylethylmethoxysilane, dimethylphenylmethoxysilane, dimethylbenzylmethoxysilane and dimethylphenethylmethoxysilane can be exemplified.

Other examples of the organic groups represented by the above $R^1$, $R^2$ and $R^3$ can include organic groups having one or more carbon-oxygen single bonds or carbon-oxygen double bonds. Specifically, they are the organic groups having one or more groups selected from the group consisting of epoxy, ester, alkoxy and hydroxy groups. The organic groups having one or more carbon-oxygen single bonds or carbon-oxygen double bonds in the general formula (3) can include those represented by the following general formula (4) as examples.

$$(P-Q_1-(S_1)_{v1}-Q_2-)_u-(T)_{v2}-Q_3-(S_2)_{v3}-Q_4- \quad (4)$$

wherein P represents a hydrogen atom, a hydroxyl group,

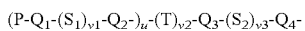

epoxy ring an alkoxy group having 1 to 4 carbon atoms, an alkylcarbonyloxy group having 1 to 6 carbon atoms or an alkylcarbonyl group having 1 to 6 carbon atoms, $Q_1$, $Q_2$, $Q_3$ and $Q_4$ each independently represent $-C_qH_{(2q-p)}P_p-$ (wherein P is the same as defined above, p is an integer of 0 to 3, q is an integer of 1 to 10, in this regard, however, q=o represents a single bond), u is an integer of 0 to 3, $S_1$ and $S_2$ each independently represents —O—, —CO—, —OCO—, —COO— or —OCOO—, and v1, v2 and v3 each independently represent 0 or 1. Together with them, T represents a bivalent group composed of an alicyclic ring or an aromatic ring which may contain heteroatoms. Examples of the alicyclic ring or an aromatic ring which may contain heteroatoms such as oxygen atoms in T are shown below. A position bound to $Q_2$ and $Q_3$ in T is not particularly limited, and can be appropriately selected in consideration of reactivity due to a steric factor and availability of commercially available reagents used for the reaction.

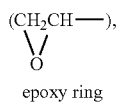
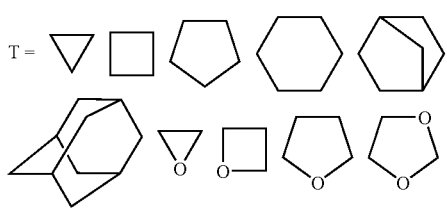

Preferable examples of the organic group having one or more carbon-oxygen single bonds or carbon-oxygen double bonds in the general formula (3) can include the followings. In the following formulae, (Si) was described in order to indicate a binding site of Si.

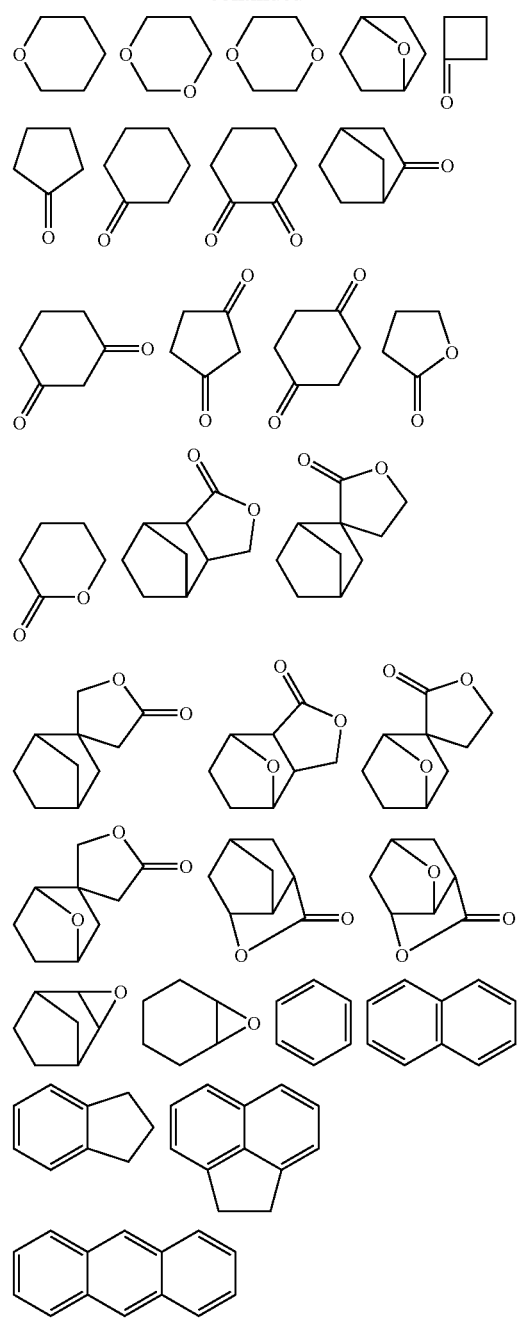
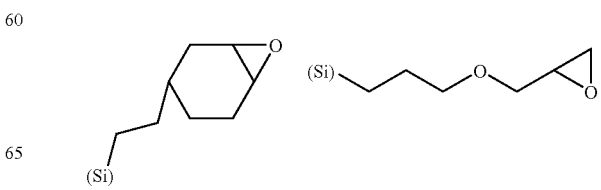

-continued
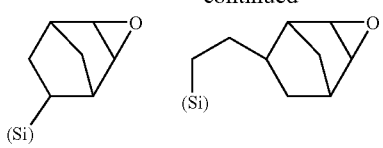
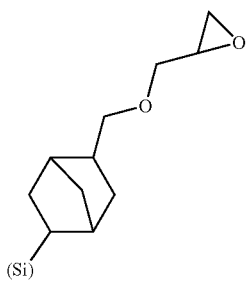
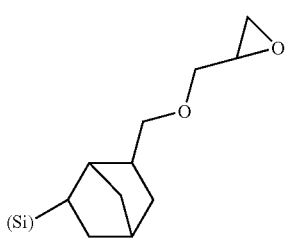
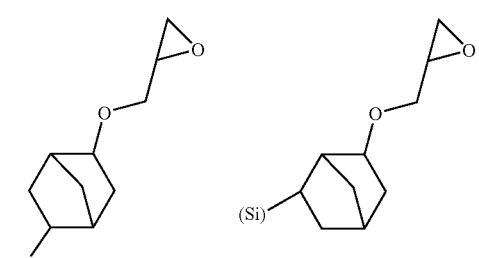
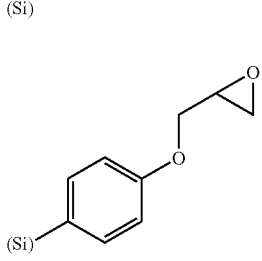
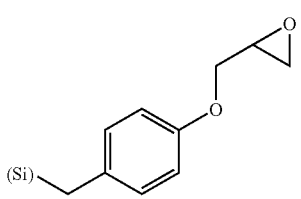
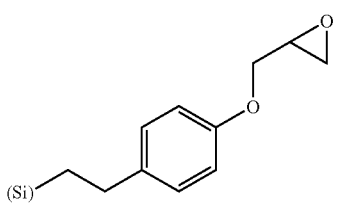
-continued
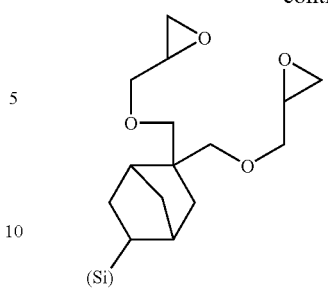
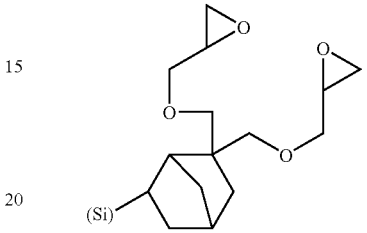
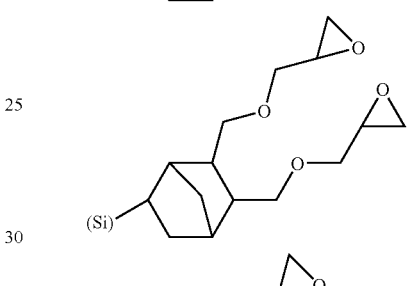
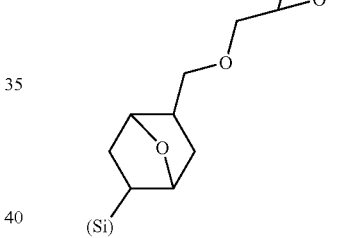
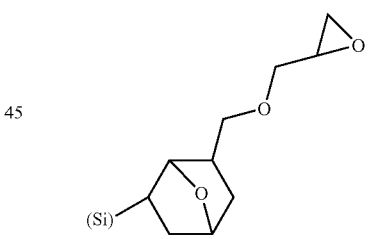
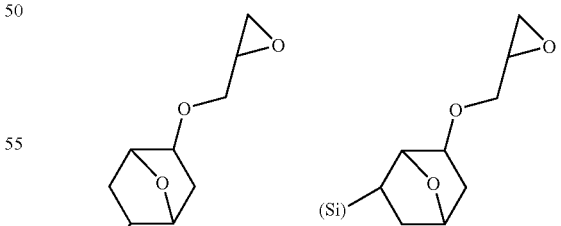
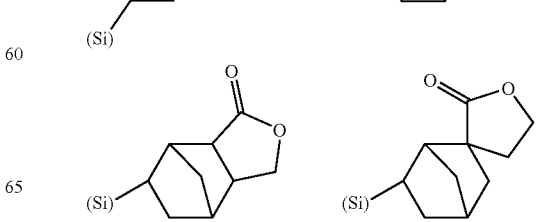

17
-continued
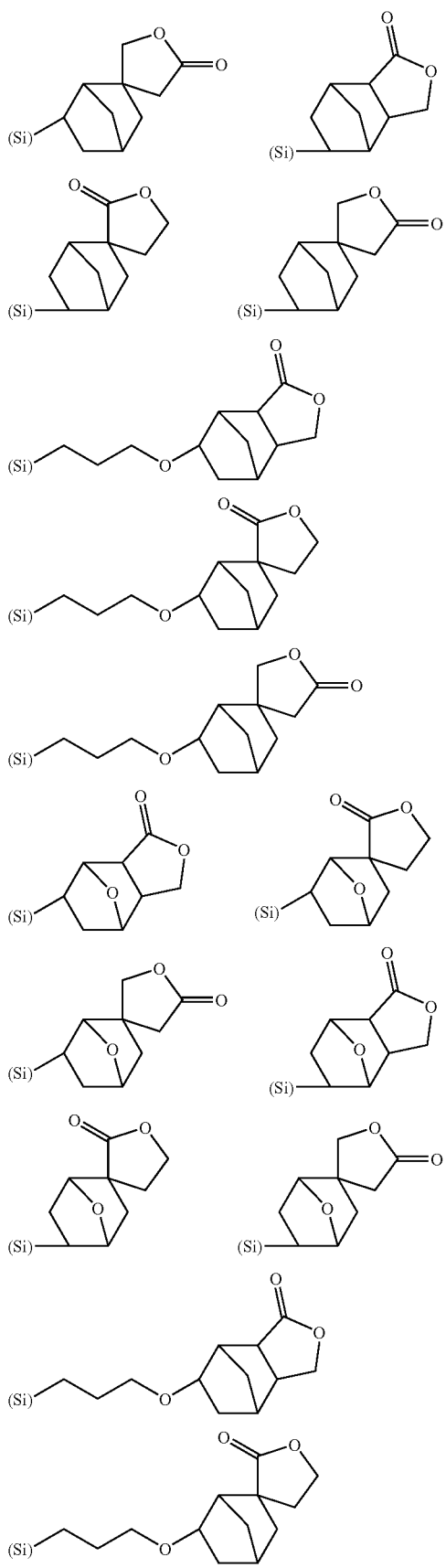
18
-continued
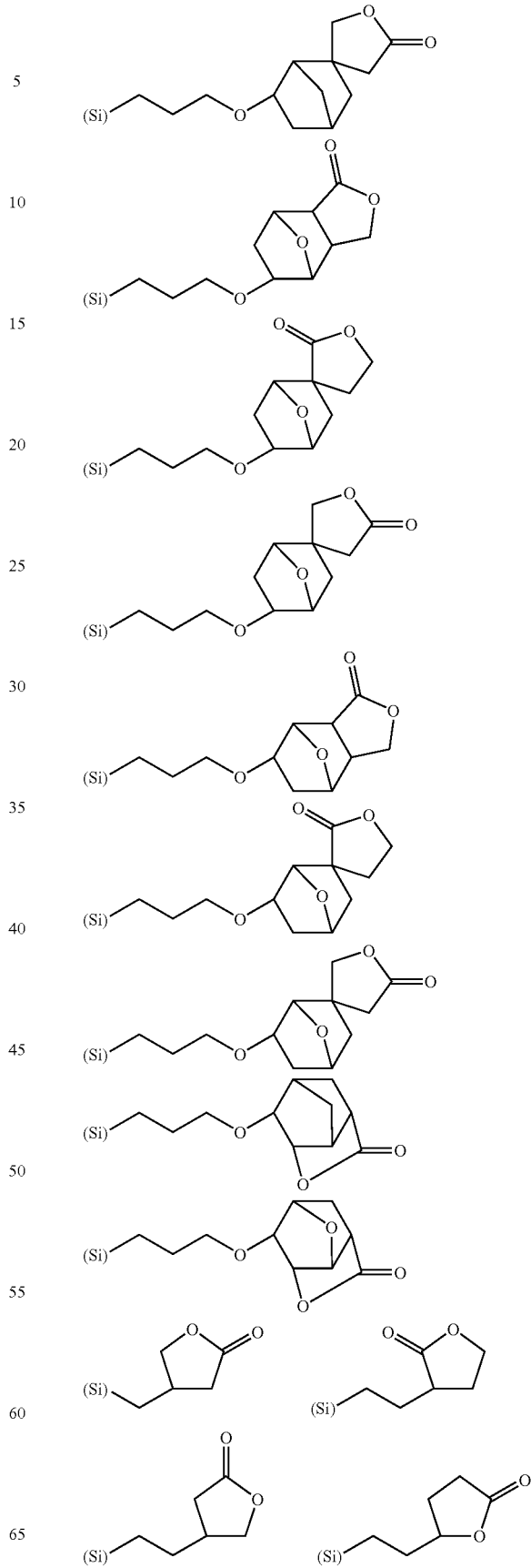

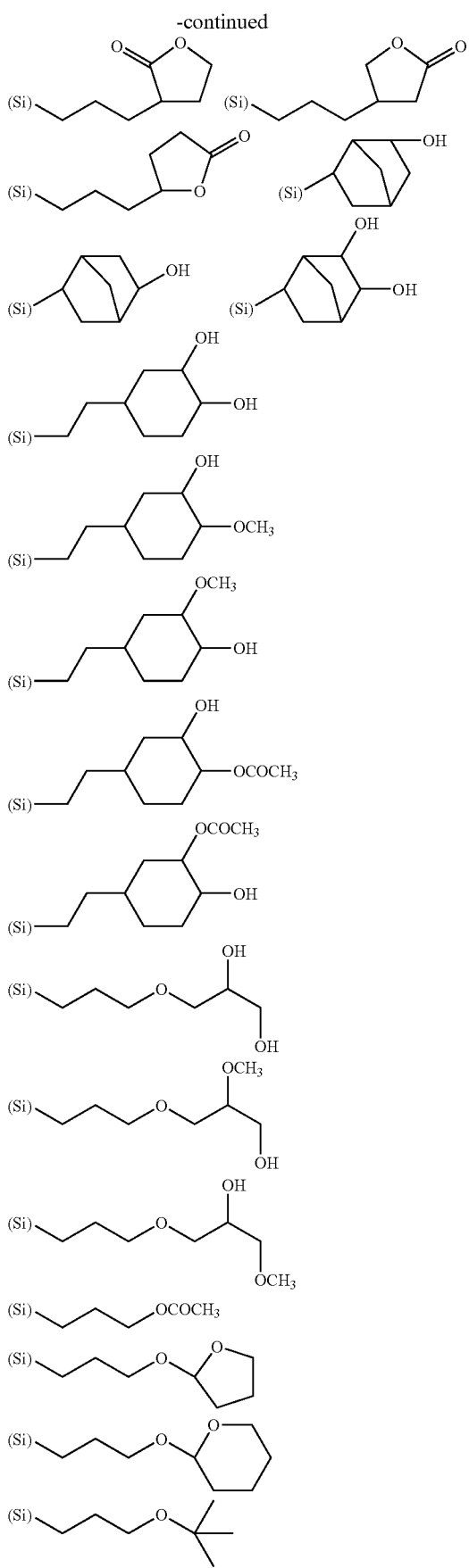
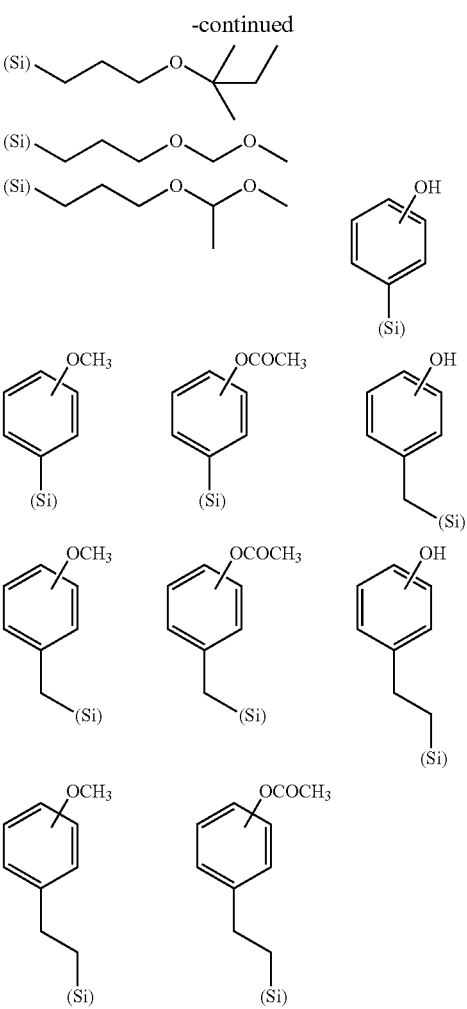
As examples of the organic groups of $R^1$, $R^2$ and $R^3$, the organic group containing the silicon-silicon bond can also be used. Specifically the followings can be included.
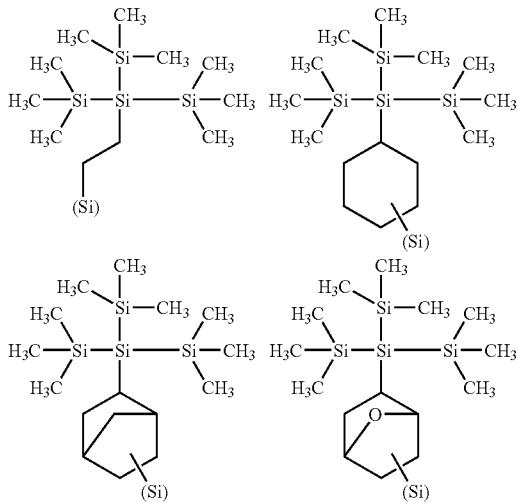

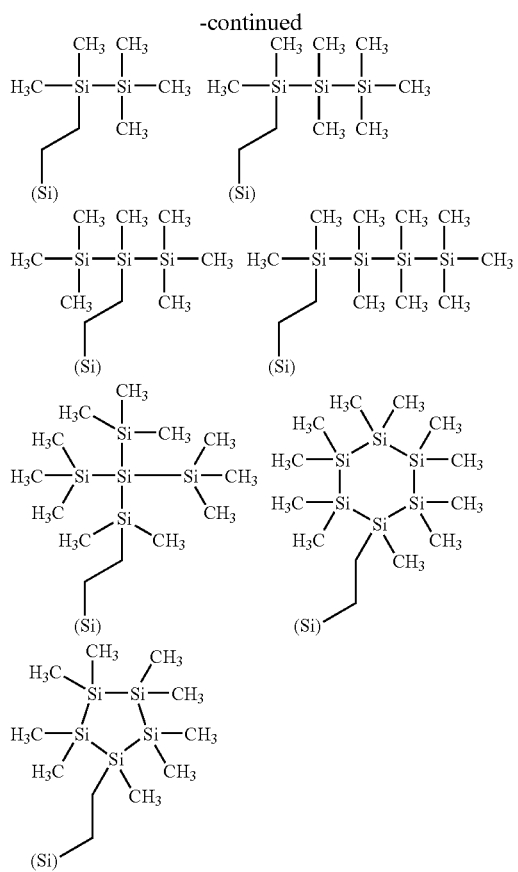

One or two or more can be selected from these hydrolyzable silicon compounds (monomers), and mixed before the reaction or during the reaction to make a reaction raw material for forming the silicon-containing compound.

The silicon-containing compound can be produced by hydrolyzing and condensing the hydrolyzable silicon compound using one or more compounds preferably selected from inorganic acids, aliphatic sulfonic acids and aromatic sulfonic acids as the acid catalyst.

The acid catalyst used at that time can include hydrofluoric acid, hydrochloric acid, hydrobromic acid, sulfuric acid, nitric acid, perchloric acid, phosphoric acid, methanesulfonic acid, benzenesulfonic acid and toluenesulfonic acid. An amount of the catalyst to be used is $10^{-6}$ to 10 mol, preferably $10^{-5}$ to 5 mol and more preferably $10^{-4}$ to 1 mol based on 1 mol of the hydrolyzable silicon compound.

The amount of water to be added when the silicon-containing compound is obtained by hydrolysis and condensation of these hydrolyzable silicon compounds is preferably 0.01 to 100 mol, more preferably 0.05 to 50 mol and still more preferably 0.1 to 30 mol based on 1 mol of a hydrolyzable substituent bound to the hydrolyzable silicon compound. The addition of more than 100 mol of the water leads to an enlarged apparatus used for the reaction, and is not economical.

As a manipulation method, the hydrolyzable silicon compound is added to an aqueous solution of the catalyst to start a hydrolysis condensation reaction. At that time, the organic solvent may be added to the aqueous solution of the catalyst, or the hydrolyzable silicon compound may be diluted with the organic solvent, or both manipulations may be carried out. A reaction temperature is 0 to 100° C. and preferably 5 to 80° C.

It is preferable that the temperature is kept at 5 to 80° C. when the monomer is dripped and subsequently the reaction is matured at 20 to 80° C.

As the organic solvent which can be added to the aqueous solution of the catalyst or can dilute the hydrolyzable silicon compound, methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexane, methyl-2-n-amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butylolactone and mixtures thereof are preferable.

Among these solvents, preferable are water-soluble solvents. Examples thereof can include alcohols such as methanol, ethanol, 1-propanol and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether and ethylene glycol monopropyl ether; acetone, acetonitrile and tetrahydrofuran. Among them, the solvents having a boiling point at 100° C. or below are particularly preferable.

The amount of the organic solvent to be used is preferably 0 to 1,000 mL and particularly 0 to 500 mL based on 1 mol of the hydrolyzable silicon compound. When the amount of the organic solvent to be used is large, a reaction vessel becomes large, which is not economical.

Subsequently if necessary, the acid catalyst is neutralized, and alcohol generated in the hydrolysis condensation reaction is removed under reduced pressure to yield the aqueous solution of the reaction mixture. At that time, the amount of an alkaline substance which can be used for the neutralization is preferably 0.1 to 2 equivalents based on the amount of the acid used as the catalyst. This alkaline substance may be any substance as long as the substance exhibits alkalinity in the water.

Subsequently, alcohol generated in the hydrolysis condensation reaction must be removed from the reaction mixture. At that time, the temperature at which the reaction mixture is heated depends on a type of alcohol generated in the reaction and the added organic solvent, and is preferably 0 to 100° C., more preferably 10 to 90° C. and still more preferably 15 to 80° C. A degree of the reduced pressure at that time varies depending on types of the organic solvent and alcohol to be removed, an evacuation apparatus, a condensation apparatus and a heating temperature, and is preferably an atmospheric pressure or below, more preferably 80 kPa or less as an absolute pressure and still more preferably 50 kPa or less as the absolute pressure. It is difficult to precisely measure the amount of alcohol removed at that time, but it is desirable that 80% by mass or more of generated alcohol is removed.

Then, the acid catalyst used for the hydrolysis condensation may be removed from the reaction mixture.

The silicon-containing compound produced by conventional art has been used for the composition for forming the coating film without substantially removing the acid catalyst used for the hydrolysis condensation. Thus, the condensation reaction catalyst is left in the composition, thus even if the composition is controlled in pH so that the condensation reaction is inhibited, the condensation of the silanol groups can not be inhibited, and only the composition whose storage stability is poor has been obtained.

It has been known that this condensation reaction is inhibited at particular pH (J. Appl. Polym. Sci., Vol. 88, 636-640 (2003) and C. J. Brinker and G. W. Scherer, "Sol-Gel Science: The Physics and Chemistry of Sol-Gel Processing", Academic Press, San Diego (1990)), and it is described to be stabilized at pH of about 1.5 (stable pH).

However, in the composition for forming the coating film obtained by using the acidic substance so that the silanol groups become the stable pH from the start as the catalyst for the hydrolysis and condensation, the amount of the residual silanol groups becomes large because the condensation reaction of the silanol groups does not proceed sufficiently. Thus, even if the composition is kept at stable pH, only the composition whose storage stability is poor can be obtained because the amount of the silanol groups is too large.

In the present invention, it has become possible to enhance the storage stability by substantially removing the acid catalyst from the silicon-containing compound obtained by using the acid catalyst optimal for the hydrolysis and condensation, and subsequently controlling to the stable pH using the component (C).

As the method of removing the acid catalyst, the water and the silicon-containing compound are mixed, and the silicon-containing compound is extracted with the organic solvent. As the organic solvent used at that time, those which can dissolve the silicon-containing compound and separates into two layers when mixed with the water. Examples thereof can include methanol, ethanol, 1-propanol, 2-propanol, 1-butanol, 2-butanol, 2-methyl-1-propanol, acetone, tetrahydrofuran, toluene, hexane, ethyl acetate, cyclohexane, methyl-2-n-amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentylmethyl ether and mixtures thereof.

Furthermore, it is possible to use the mixture of a water-soluble organic solvent and a water-hardly soluble organic solvent. For example, the combinations such as methanol+ethyl acetate, ethanol+ethyl acetate, 1-propanol+ethyl acetate, 2-propanol+ethyl acetate, butanediol monomethyl ether+ethyl acetate, propylene glycol monomethyl ether+ethyl acetate, ethylene glycol monomethyl ether, butanediol monoethyl ether+ethyl acetate, propylene glycol monoethyl ether+ethyl acetate, ethylene glycol monoethyl ether+ethyl acetate, butanediol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentylmethyl ether, ethanol+cyclopentylmethyl ether, 1-propanol+cyclopentylmethyl ether, 2-propanol+cyclopentylmethyl ether, propylene glycol monomethyl ether+cyclopentylmethyl ether, ethylene glycol monomethyl ether+cyclopentylmethyl ether, propylene glycol monoethyl ether+cyclopentylmethyl ether, ethylene glycol monoethyl ether+cyclopentylmethyl ether, propylene glycol monopropyl ether+cyclopentylmethyl ether, ethylene glycol monopropyl ether+cyclopentylmethyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate are preferable, but the combinations are not limited thereto.

A mixed ratio of the water-soluble organic solvent and the water-hardly soluble organic solvent is appropriately selected, and the amount of the water-soluble organic solvent is 0.1 to 1,000 parts by mass, preferably 1 to 500 parts by mass and more preferably 2 to 100 parts by mass based on the 100 parts by mass of the water-hardly organic soluble solvent.

Subsequently, the composition is washed with neutral water. As this water, those typically referred to as deionized water or ultrapure water may be used. The amount of this water is 0.01 to 100 L, preferably 0.05 to 50 L and more preferably 0.1 to 5 L based on 1L of a silicon-containing compound solution. In the method of this washing, both liquids may be placed in the same vessel, stirred and left stand to separate an aqueous layer. The washing may be performed once or more, but even if washing is performed 10 times or more, no effect corresponding to the washing is obtained, and thus, the washing is performed about once to five times.

The other method of removing the acid catalyst can include the method by ion exchange resins and the method of neutralizing with the epoxy compound such as ethylene oxide or propylene oxide followed by removing the acid catalyst. The method can be appropriately selected depending on the acid catalyst used for the reaction.

In the above removal of the catalyst, the substantial removal of the acid catalyst means that it is acceptable that the amount of the remaining acid catalyst used for the reaction is about 10% by mass or less and preferably about 5% by mass or less based on the amount added to the silicon-containing compound when the reaction was started.

A portion of the silicon-containing compound is migrated into the aqueous layer by washing manipulation at that time, and the effect substantially equivalent to the fractionation is obtained in some cases. Thus, a frequency of washing and the amount of washing water may be appropriately selected in the light of catalyst removal effect and fractionation effect.

In any case of the solutions of the silicon-containing compound, in which the acid catalyst remains and the acid catalyst has been removed, the silicon-containing compound solution is obtained by adding the final solvent and exchanging the solvent under reduced pressure. The temperature in the solvent exchange at that time depends on the types of the reaction solvent to be removed and the extraction solvent, and is preferably 0 to 100° C., more preferably 10 to 90° C. and still more preferably 15 to 80° C. The degree of the reduced pressure at that time varies depending on the types of the extraction solvent to be removed, the evacuation apparatus, the condensation apparatus and the heating temperature, and is preferably an atmospheric pressure or below, more preferably 80 kPa or less as the absolute pressure and still more preferably 50 kPa or less as the absolute pressure.

At that time, the silicon-containing compound becomes unstable in some cases by changing the solvent. This occurs due to the compatibility of the final solvent and the silicon-containing compound, and in order to prevent this, the component (C) described later may be added as the stabilizer. The amount of the component (C) to be added is 0 to 25 parts by mass, preferably 0 to 15 parts by mass and more preferably 0 to 5 parts by mass based on 100 parts by mass of the silicon-containing compound in the solution before the solvent exchange, but when added, 0.5 parts by weight or more is preferable. If necessary, the component (C) may be added to the solution before the solvent exchange and then the solvent may be exchanged.

When the silicon-containing compound is concentrated to a certain concentration or higher, the condensation reaction proceeds to be changed to the state of being incapable of being dissolved again in the organic solvent. Thus, it is preferable to keep the solvent state at appropriate concentration. The concentration at that time is 50% by mass or less, preferably 40% by mass or less and more preferably 30% by mass or less.

The preferable final solvent to be added to the silicon-containing compound solution is an alcohol-based solvent, and particularly preferable are monoalkyl ether of ethylene glycol, diethylene glycol and triethylene glycol and monoalkyl ether of propylene glycol and dipropylene glycol. Specifically, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether and ethylene glycol monopropyl ether are preferable.

As another reaction manipulation when the hydrolyzable silicon compound is hydrolyzed and condensed, the water or a water-containing organic solvent is added to the monomer or an organic solution of the monomer to start the hydrolytic reaction. At that time, the catalyst may be added to the monomer or the organic solution of the monomer or may be added to the water or the water-containing organic solvent. The reaction temperature is 0 to 100° C. and preferably 10 to 80° C. It is preferable that the monomer is heated to 10 to 50° C. upon dropping the water and subsequently the reaction is matured by raising the temperature to 20 to 80° C.

When the organic solvent is used, the water-soluble organic solvent is preferable. Examples thereof can include methanol, ethanol, 1-propanol, 2-propanol, 1-butanol, 2-butanol, 2-methyl-1-propanol, acetone, tetrahydrofuran, acetonitrile, polyvalent alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate and propylene glycol monopropyl ether, and mixtures thereof.

The amount of the organic solvent to be used may be the same as the above amount. The post-treatment of the obtained reaction mixture is performed in the same way as in the above method to yield the silicon-containing compound.

The molecular weight of the resulting silicon-containing compound can be controlled by not only the selection of the monomer but also the control of the reaction condition upon polymerization. If the compound having a weight average molecular weight of more than 100,000 is used, a foreign material and a coating patch occur in some cases. Thus, the weight average molecular weight is preferably 100,000 or less, more preferably 200 to 50,000 and still more preferably 300 to 30,000. For the above weight average molecular weight data, the molecular weight is measured by gel permeation chromatography (GPC) using RI as a detector and represented in terms of polystyrene using polystyrene as a standard substance.

The composition for forming the silicon-containing film of the present invention may contain two or more silicon-containing compounds whose compositions and/or reaction conditions are different as long as they are produced under an acidic condition.

The composition for forming the silicon-containing film can be made by further compounding the thermal crosslinking accelerator (B), the monovalent or bivalent or more organic acid having 1 to 30 carbon atoms (C), trivalent or more alcohol (D) and the organic solvent (E) with the above silicon-containing compound (A).

Conventionally, the silicon-containing compound has been cured at high temperature of 300° C. or above or with the acid catalyst by a thermal acid generator. In the present invention, the film can be cured efficiency by changing pH around the silanol group from the stable pH to an unstable pH region (around pH 3) with the action of the added component (B) when the composition is coated and thermally cured. That is, when the film is cured in the same temperature condition as the conventional condition, the film in which the crosslinking has further proceeded compared with the conventional cured film can be provided. Thus, the migration of the active component in the photoresist film to the silicon-containing film is inhibited, almost the same lithography property as in the ordinary organic antireflection film can be obtained.

As described above, in the present invention, the thermal crosslinking accelerator must be contained as the component (B) in order to further accelerate the crosslinking reaction when the silicon-containing film is formed. Such a thermal crosslinking accelerator can include the compounds represented by the general formula (1) or (2).

$$L_aH_bX \qquad (1),$$

wherein L represents lithium, sodium, potassium, rubidium or cesium, X represents a hydroxyl group or a monovalent or bivalent or more organic acid group having 1 to 30 carbon atoms, a represents an integer of 1 or more, b represents an integer of 0 or 1 or more, and a+b is a valence of the hydroxyl group or the organic acid group;

$$M_{a'}H_{b'}A \qquad (2),$$

wherein M represents sulfonium, iodonium or ammonium, A represents a hydroxyl group or a monovalent or bivalent or more organic acid group having 1 to 30 carbon atoms or non-nucleophilic counter ion, a' represents an integer of 1 or more, b' represents an integer of 0 or 1 or more, and a'+b' is a valence of the hydroxyl group, the organic acid group or the non-nucleophilic counter ion.

As the compounds represented by the general formula (1), alkali metal organic acid salts can be exemplified. Examples thereof include monovalent salts such as hydroxy salts, formate salts, acetate salts, propionate salts, butanoate salts, pentanoate salts, hexanoate salts, heptanoate salts, octanoate salts, nonanoate salts, decanoate salts, oleate salts, stearate salts, linoleate salts, linolenate salts, benzoate salts, phthalate salts, isophthalate salts, terephthalate salts, salicylate salts, trifluoroacetate salts, monochloroacetate salts, dichloroacetate salts and trichloroacetate salts, monovalent or bivalent oxalate salts, malonate salts, methylmalonate salts, ethylmalonate salts, propylmalonate salts, butylmalonate salts, dimethylmalonate salts, diethylmalonate salts, succinate salts, methylsuccinate salts, glutarate salts, adipate salts, itaconate salts, maleate salts, fumarate salts, citraconate salts, citrate salts and carbonate salts of lithium, sodium, potassium, rubidium and cesium.

Specifically, lithium formate, lithium acetate, lithium propionate, lithium butanoate, lithium pentanoate, lithium hexanoate, lithium heptanoate, lithium octanoate, lithium nonanoate, lithium decanoate, lithium oleate, lithium stearate, lithium linoleate, lithium linolenate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydoxide, lithium hydrogen oxalate, lithium hydrogen malonate, lithium hydrogen methylmalonate, lithium hydrogen ethylmalonate, lithium hydrogen propylmalonate, lithium hydrogen butylmalonate, lithium hydrogen dimethylmalonate, lithium hydrogen diethylmalonate, lithium hydrogen succinate, lithium hydrogen methylsuccinate, lithium hydrogen glutarate, lithium hydrogen adipate, lithium hydrogen itaconate, lithium hydrogen maleate, lithium hydrogen fumarate, lithium hydrogen citraconate, lithium hydrogen citrate, lithium hydrogen carbonate, lithium oxalate, lithium malonate, lithium methylmalonate, lithium ethylmalonate, lithium propylmalonate, lithium butylmalonate, lithium dimethylmalonate, lithium diethylmalonate, lithium succinate, lithium methylsuccinate, lithium glutarate, lithium adipate, lithium itaconate, lithium maleate, lithium fumarate, lithium citraconate, lithium citrate, lithium carbonate, sodium formate, sodium acetate, sodium propionate, sodium butanoate, sodium pentanoate, sodium hexanoate, sodium heptanoate, sodium octanoate, sodium nonanoate, sodium decanoate, sodium oleate, sodium stearate, sodium linoleate, sodium linolenate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydoxide, sodium hydrogen oxalate, sodium hydrogen malonate, sodium hydrogen methylmalonate, sodium hydrogen ethylmalonate, sodium hydrogen propylmalonate, sodium hydrogen butylmalonate, sodium hydrogen dimethylmalonate, sodium hydrogen diethylmalonate, sodium hydrogen succinate, sodium hydrogen methylsuccinate, sodium hydrogen glutarate, sodium hydrogen adipate, sodium hydrogen itaconate, sodium hydrogen maleate, sodium hydrogen fumarate, sodium hydrogen citraconate, sodium hydrogen citrate, sodium hydrogen carbonate, sodium oxalate, sodium malonate, sodium methylmalonate, sodium ethylmalonate, sodium propylmalonate, sodium butylmalonate, sodium dimethylmalonate, sodium diethylmalonate, sodium succinate, sodium methylsuccinate, sodium glutarate, sodium adipate, sodium itaconate, sodium maleate, sodium fumarate, sodium citraconate, sodium citrate, sodium carbonate, potassium formate, potassium acetate, potassium propionate, potassium butanoate, potassium pentanoate, potassium hexanoate, potassium heptanoate, potassium octanoate, potassium nonanoate, potassium decanoate, potassium oleate, potassium stearate, potassium linoleate, potassium linolenate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydoxide, potassium hydrogen oxalate, potassium hydrogen malonate, potassium hydrogen methylmalonate, potassium hydrogen ethylmalonate, potassium hydrogen propylmalonate, potassium hydrogen butylmalonate, potassium hydrogen dimethylmalonate, potassium hydrogen diethylmalonate, potassium hydrogen succinate, potassium hydrogen methylsuccinate, potassium hydrogen glutarate, potassium hydrogen adipate, potassium hydrogen itaconate, potassium hydrogen maleate, potassium hydrogen fumarate, potassium hydrogen citraconate, potassium hydrogen citrate, potassium hydrogen carbonate, potassium oxalate, potassium malonate, potassium methylmalonate, potassium ethylmalonate, potassium propylmalonate, potassium butylmalonate, potassium dimethylmalonate, potassium diethylmalonate, potassium succinate, potassium methylsuccinate, potassium glutarate, potassium adipate, potassium itaconate, potassium maleate, potassium fumarate, potassium citraconate, potassium citrate and potassium carbonate and the like can be exemplified.

The compounds represented by the general formula (2) can include sulfonium compounds, iodonium compounds and ammonium compounds represented by (Q-1), (Q-2) and (Q-3), respectively.

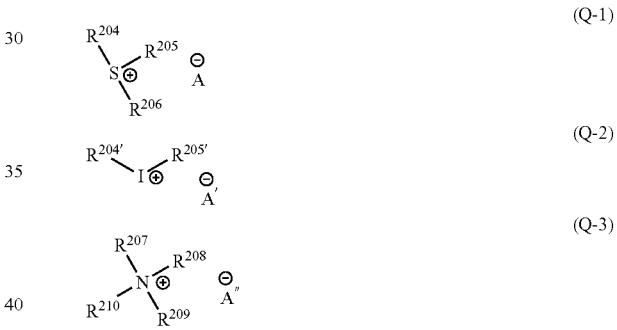

In the formulae, $R^{204}$, $R^{205}$, $R^{206}$, $R^{204'}$ and $R^{205'}$ each represent straight, branched or cyclic alkyl, alkenyl, oxoalkyl or oxoalkenyl groups having 1 to 12 carbon atoms, substituted or unsubstituted aryl groups having 6 to 20 carbon atoms, or aralkyl or aryloxoalkyl groups having 7 to 12 carbon atoms, and a part or all of hydrogen atoms in these groups may be substituted with alkoxy groups; $R^{205}$ and $R^{206}$ may form a ring, when they form the ring, $R^{205}$ and $R^{206}$ each represent alkylene groups having 1 to 6 carbon atoms; $A^-$, $A'^-$ and $A''^-$ represent non-nucleophilic counter ions; $R^{207}$ $R^{208}$, $R^{209}$ and $R^{210}$ are the same as $R^{204}$, $R^{205}$, $R^{206}$, $R^{204'}$ and $R^{205'}$ but may be hydrogen atoms; $R^{207}$ and $R^{208}$, $R^{207}$ and $R^{208}$ and $R^{209}$ may form a ring, when they form the ring, $R^{207}$ and $R^{208}$, $R^{207}$ and $R^{208}$ and $R^{209}$ represent alkylene groups having 3 to 10 carbon atoms.

The above $R^{204}$, $R^{205}$, $R^{204'}$, $R^{205'}$, $R^{206}$, $R^{207}$, $R^{208}$, $R^{209}$ and $R^{210}$ may be the same or different one another, and specifically include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl and adamantyl as alkyl groups. As alkenyl groups, vinyl, allyl, propenyl, butenyl, hexenyl and cyclohexenyl are included. As oxoalkyl groups, 2-oxocyclopentyl and 2-oxocyclohexyl are included, and 2-oxopropyl, 2-cyclopentyl-2-oxoethyl, 2-cyclohexyl-2- oxoethyl and 2-(4-methylcyclohexyl)-2-oxoethyl can be included. As aryl groups, phenyl, naphthyl, alkoxyphenyl groups such as p-methoxyphenyl, m-methoxyphenyl, o-methoxyphenyl, ethoxyphenyl, p-tert-butoxyphenyl and m-tert-butoxyphenyl, alkylphenyl groups such as 2-methylphenyl, 3-methylphenyl, 4-methylphenyl, ethylphenyl, 4-tert-butylphenyl, 4-butylphenyl and dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl are included. As aralkyl groups, benzyl, phenylethyl and phenethyl are included. As aryloxoalkyl groups, 2-aryl-2-oxoethyl groups such as 2-phenyl-2-oxoethyl, 2-(l-naphthyl)-2-oxoethyl and 2-(2-naphthyl)-2-oxoethyl are included.

$A^-$, $A'^-$ and $A''^-$ include hydroxy ions, formate ions, acetate ions, propionate ions, butanoate ions, pentanoate ions, hexanoate ions, heptanoate ions, octanoate ions, nonanoate ions, decanoate ions, oleate ions, stearate ions, linoleate ions, linolenate ions, benzoate ions, p-methylbenzoate ions, p-t-butylbenzoate ions, phthalate ions, isophthalate ions, terephthalate ions, salicylate ions, trifluoroacetate ions, monochloroacetate ions, dichloroacetate ions, trichloroacetate ions, fluoride ions, chloride ions, bromide ions, iodide ions, nitrate ions, chlorate ions, perchlorate ions, bromate ions, iodate ions, oxalate ions, malonate ions, methylmalonate ions, ethylmalonate ions, propylmalonate ions, butylmalonate ions, dimethylmalonate ions, diethylmalonate ions, succinate ions, methylsuccinate ions, glutarate ions, adipate ions, itaconate ions, maleate ions, fumarate ions, citraconate ions, citrate ions and carbonate ions.

Specifically the sulfonium compound includes triphenylsulfonium formate, triphenylsulfonium acetate, triphenylsulfonium propionate, triphenylsulfonium butanoate, triphenylsulfonium pentanoate, triphenylsulfonium hexanoate, triphenylsulfonium heptanoate, triphenylsulfonium octanoate, triphenylsulfonium nonanoate, triphenylsulfonium decanoate, triphenylsulfonium oleate, triphenylsulfonium stearate, triphenylsulfonium linoleate, triphenylsulfonium linolenate, triphenylsulfonium benzoate, triphenylsulfonium p-methylbenzoate, triphenylsulfonium p-t-butylbenzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, triphenylsulfonium chloride triphenylsulfonium bromide, triphenylsulfonium iodide, triphenylsulfonium nitrate, triphenylsulfonium chlorate, triphenylsulfonium perchlorate, triphenylsulfonium bromate, triphenylsulfonium iodate, bistriphenylsulfonium oxalate, bistriphenylsulfonium malonate, bistriphenylsulfonium methylmalonate, bistriphenylsulfonium ethylmalonate, bistriphenylsulfonium propylmalonate, bistriphenylsulfonium butylmalonate, bistriphenylsulfonium dimethylmalonate, bistriphenylsulfonium diethylmalonate, bistriphenylsulfonium succinate, bistriphenylsulfonium methylsuccinate, bistriphenylsulfonium glutarate, bistriphenylsulfonium adipate, bistriphenylsulfonium itaconate, bistriphenylsulfonium maleate, bistriphenylsulfonium fumarate, bistriphenylsulfonium citraconate, bistriphenylsulfonium citrate and bistriphenylsulfonium carbonate.

The iodonium compounds specifically include diphenyliodonium formate, diphenyliodonium acetate, diphenyliodonium propionate, diphenyliodonium butanoate, diphenyliodonium pentanoate, diphenyliodonium hexanoate, diphenyliodonium heptanoate, diphenyliodonium octanoate, diphenyliodonium nonanoate, diphenyliodonium decanoate, diphenyliodonium oleate, diphenyliodonium stearate, diphenyliodonium linoleate, diphenyliodonium linolenate, diphenyliodonium benzoate, diphenyliodonium p-methylbenzoate, diphenyliodonium p-t-butylbenzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium oxalate, diphenyliodonium malonate, diphenyliodonium methylmalonate, diphenyliodonium ethylmalonate, diphenyliodonium propylmalonate, diphenyliodonium butylmalonate, diphenyliodonium dimethylmalonate, diphenyliodonium diethylmalonate, diphenyliodonium succinate, diphenyliodonium methylsuccinate, diphenyliodonium glutarate, diphenyliodonium adipate, diphenyliodonium itaconate, diphenyliodonium maleate, diphenyliodonium fumarate, diphenyliodonium citraconate, diphenyliodonium citrate, diphenyliodonium carbonate, diphenyliodonium chloride, diphenyliodonium bromide, diphenyliodonium iodide, diphenyliodonium nitrate, diphenyliodonium chlorate, diphenyliodonium perchlorate, diphenyliodonium bromate, diphenyliodonium iodate, bisdiphenyliodonium oxalate, bisdiphenyliodonium malonate, bisdiphenyliodonium methylmalonate, bisdiphenyliodonium ethylmalonate, bisdiphenyliodonium propylmalonate, bisdiphenyliodonium butylmalonate, bisdiphenyliodonium dimethylmalonate, bisdiphenyliodonium diethylmalonate, bisdiphenyliodonium succinate, bisdiphenyliodonium methylsuccinate, bisdiphenyliodonium glutarate, bisdiphenyliodonium adipate, bisdiphenyliodonium itaconate, bisdiphenyliodonium maleate, bisdiphenyliodonium fumarate, bisdiphenyliodonium citraconate, bisdiphenyliodonium citrate and bisdiphenyliodonium carbonate.

Meanwhile, as the ammonium compound specifically tetramethylammonium formate, tetramethylammonium acetate, tetramethylammonium propionate, tetramethylammonium butanoate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oleate, tetramethylammonium stearate, tetramethylammonium linoleate, tetramethylammonium linolenate, tetramethylammonium benzoate, tetramethylammonium p-methylbenzoate, tetramethylammonium p-t-butylbenzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium oxalate, tetramethylammonium malonate, tetramethylammonium methylmalonate, tetramethylammonium ethylmalonate, tetramethylammonium propylmalonate, tetramethylammonium butylmalonate, tetramethylammonium dimethylmalonate, tetramethylammonium diethylmalonate, tetramethylammonium succinate, tetramethylammonium methylsuccinate, tetramethylammonium glutarate, tetramethylammonium adipate, tetramethylammonium itaconate, tetramethylammonium maleate, tetramethylammonium fumarate, tetramethylammonium citraconate, tetramethylammonium citrate, tetramethylammonium carbonate, tetramethylammonium chloride, tetramethylammonium bromide, tetramethylammonium iodide, tetramethylammonium nitrate, tetramethylammonium chlorate, tetramethylammonium perchlorate, tetramethylammonium bromate, tetramethylammonium iodate, bistetramethylammonium oxalate, bistetramethylammonium malonate, bistetramethylammonium methylmalonate, bistetramethylammonium ethylmalonate, bistetramethylammonium propylmalonate, bistetramethylammonium butylmalonate, bistetramethylammonium dimethylmalonate, bistetramethylammonium diethylmalonate, bistetramethylammonium succinate, bistetramethylammonium methylsuccinate, bistetramethylammonium glutarate, bistetramethylammonium adipate, bistetramethylammonium itaconate, bistetramethylammonium maleate, bistetramethylammonium fumarate, bistetramethylammonium citraconate, bistetramethylammonium citrate, bistetramethylammonium carbonate, tetrapropylammonium formate, tetrapropylammonium acetate, tetrapropylammonium propionate, tetrapropylammonium butanoate, tetrapropylammonium pentanoate, tetrapropylammonium hexanoate, tetrapropylammonium heptanoate, tetrapropylammonium octanoate, tetrapropylammonium nonanoate, tetrapropylammonium decanoate, tetrapropylammonium oleate, tetrapropylammonium stearate, tetrapropylammonium linoleate, tetrapropylammonium linolenate, tetrapropylammonium benzoate, tetrapropylammonium p-methylbenzoate, tetrapropylammonium p-t-butylbenzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium oxalate, tetrapropylammonium malonate, tetrapropylammonium methylmalonate, tetrapropylammonium ethylmalonate, tetrapropylammonium propylmalonate, tetrapropylammonium butylmalonate, tetrapropylammonium dimethylmalonate, tetrapropylammonium diethylmalonate, tetrapropylammonium succinate, tetrapropylammonium methylsuccinate, tetrapropylammonium glutarate, tetrapropylammonium adipate, tetrapropylammonium itaconate, tetrapropylammonium maleate, tetrapropylammonium fumarate, tetrapropylammonium citraconate, tetrapropylammonium citrate, tetrapropylammonium carbonate, tetrapropylammonium chloride, tetrapropylammonium bromide, tetrapropylammonium iodide, tetrapropylammonium nitrate, tetrapropylammonium chlorate, tetrapropylammonium perchlorate, tetrapropylammonium bromate, tetrapropylammonium iodate, bistetrapropylammonium oxalate, bistetrapropylammonium malonate, bistetrapropylammonium methylmalonate, bistetrapropylammonium ethylmalonate, bistetrapropylammonium propylmalonate, bistetrapropylammonium butylmalonate, bistetrapropylammonium dimethylmalonate, bistetrapropylammonium diethylmalonate, bistetrapropylammonium succinate, bistetrapropylammonium methylsuccinate, bistetrapropylammonium glutarate, bistetrapropylammonium adipate, bistetrapropylammonium itaconate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oleate, tetrabutylammonium stearate, tetrabutylammonium linoleate, tetrabutylammonium linolenate, tetrabutylammonium benzoate, tetrabutylammonium p-methylbenzoate, tetrabutylammonium p-t-butylbenzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium oxalate, tetrabutylammonium malonate, tetrabutylammonium methylmalonate, tetrabutylammonium ethylmalonate, tetrabutylammonium propylmalonate, tetrabutylammonium butylmalonate, tetrabutylammonium dimethylmalonate, tetrabutylammonium diethylmalonate, tetrabutylammonium succinate, tetrabutylammonium methylsuccinate, tetrabutylammonium glutarate, tetrabutylammonium adipate, tetrabutylammonium itaconate, tetrabutylammonium maleate, tetrabutylammonium fumarate, tetrabutylammonium citraconate, tetrabutylammonium citrate, tetrabutylammonium carbonate, tetrabutylammonium chloride, tetrabutylammonium bromide, tetrabutylammonium iodide, tetrabutylammonium nitrate, tetrabutylammonium chlorate, tetrabutylammonium perchlorate, tetrabutylammonium bromate, tetrabutylammonium iodate, bistetrabutylammonium oxalate, bistetrabutylammonium malonate, bistetrabutylammonium methylmalonate, bistetrabutylammonium ethylmalonate, bistetrabutylammonium propylmalonate, bistetrabutylammonium butylmalonate, bistetrabutylammonium dimethylmalonate, bistetrabutylammonium diethylmalonate, bistetrabutylammonium succinate, bistetrabutylammonium methylsuccinate, bistetrabutylammonium glutarate, bistetrabutylammonium adipate, bistetrabutylammonium itaconate, bistetrabutylammonium maleate, bistetrabutylammonium fumarate, bistetrabutylammonium citraconate, bistetrabutylammonium citrate and bistetrabutylammonium carbonate can be exemplified.

The above thermal crosslinking accelerator (B) can be used alone or in combination of two or more. The amount of the thermal crosslinking accelerator to be added is preferably 0.01 to 50 parts by mass and more preferably 0.1 to 40 parts by mass based on 100 parts by mass of a base polymer (the silicon-containing compound (A) obtained by the above method).

When the entire above thermal crosslinking accelerators (B) is not volatilized upon curing with heating, it remains possible that the component (B) is left in the silicon-containing film. This component potentially deteriorates the resist film pattern profile. Meanwhile, by the use of the compound in which a cation moiety of the component (B) is degraded upon exposure, it becomes possible to prevent the resist film pattern profile from being deteriorated upon exposure. Thus, a curing performance of the silicon-containing compound is exponentially enhanced, and it becomes possible to form the silicon-containing cured film having the good lithography profile.

The monovalent or bivalent or more organic acid having 1 to 30 carbon atoms must be added as the component (C) in order to assure the stability of the thermosetting composition for forming the silicon-containing film. As the acid added at that time, formic acid, acetic acid, propionic acid, butanoic acid, pentanoic acid, hexanoic acid, heptanoic acid, octanoic acid, nonanoic acid, denanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid and citric acid can be exemplified. In particular, oxalic acid, maleic acid, formic acid, acetic acid, propionic acid and citric acid are preferable. Two or more acids may be used in mixture in order to keep the stability. The amount of the acid to be added is 0.001 to 25 parts by mass, preferably 0.01 to 15 parts by mass and more preferably 0.1 to 5 parts by mass based on 100 parts by mass of the silicon-containing compound contained in the composition.

Alternatively, the above organic acid may be compounded so that pH is preferably $0 \leq pH \leq 7$, more preferably $0.3 \leq pH \leq 6.5$ and still more preferably $0.5 \leq pH \leq 6$ in terms of pH in the composition.

When trivalent or more alcohol (D) is further added as a crosslinking agent, the composition for forming the silicon-containing film is obtained which can form the silicon-containing film which can be delaminated with the solution using sulfuric acid/hydrogen peroxide or ammonia/hydrogen peroxide used in a delamination process. Among such trivalent or more alcohols, alcohol having two or more primary hydroxyl groups is preferable. One example thereof can include the compounds shown below.

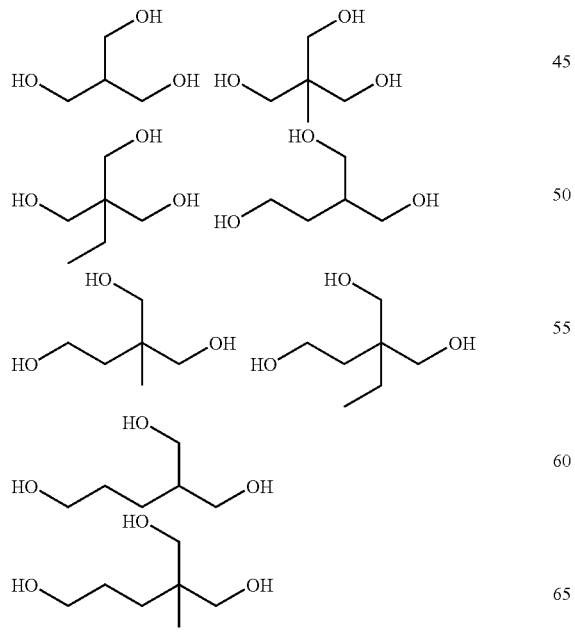

-continued

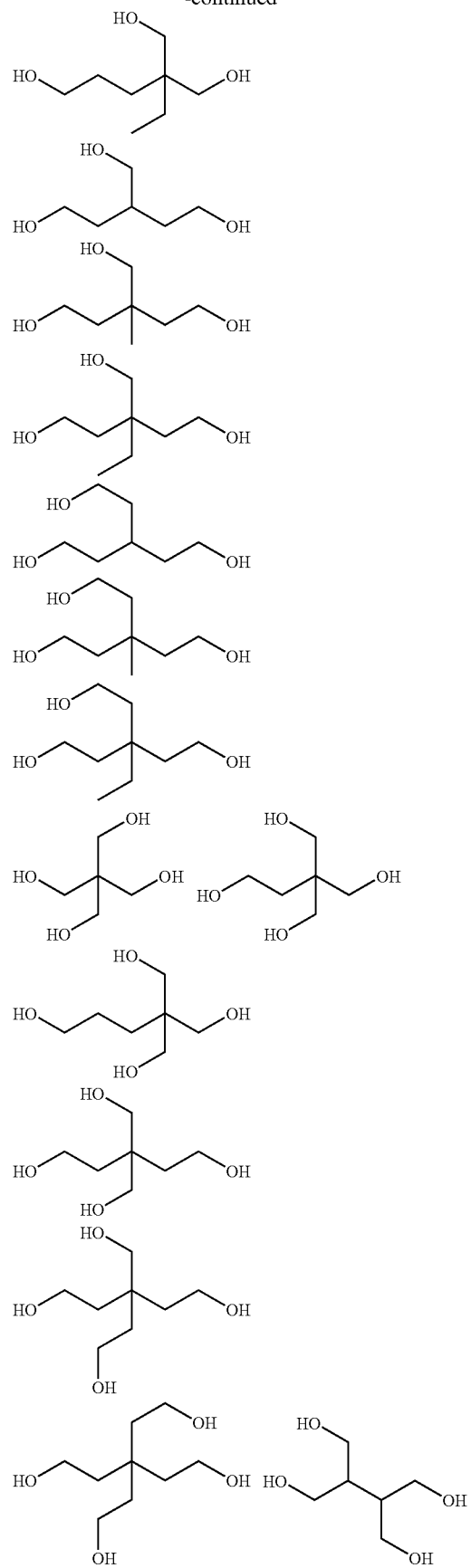

-continued

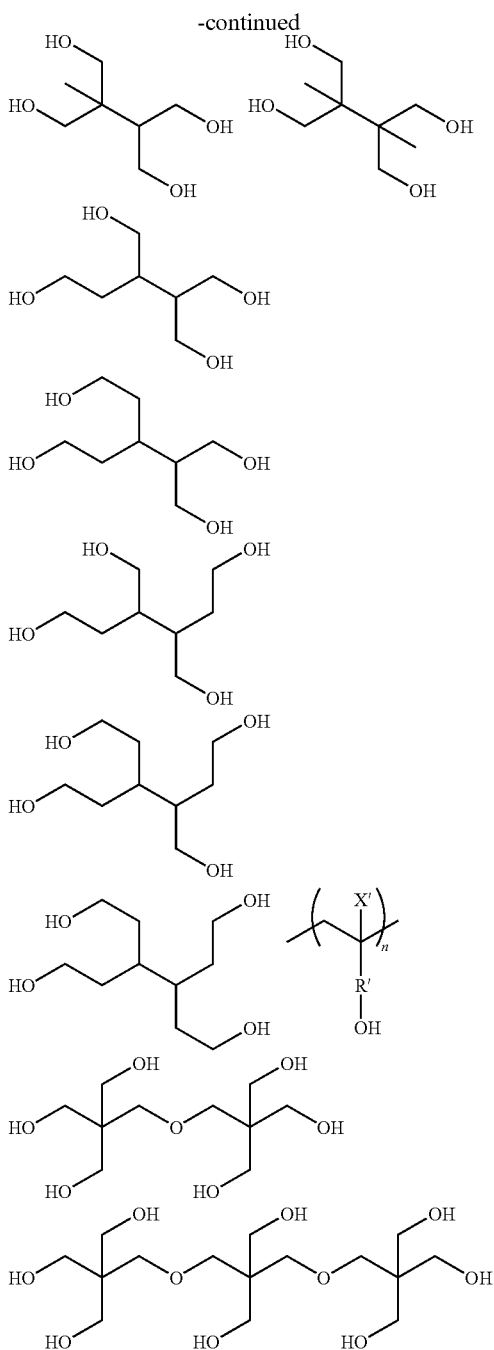

In the formulae, X' represents hydrogen or methyl, R' represents an organic group having one or more carbon atoms and having methylene as the carbon at a hydroxyl group side, and n represents an integer of 3 or more and less than 100.

The above crosslinking agent can be used alone or in combination of two or more. The amount of the crosslinking agent to be added is preferably 0.001 to 50 parts by mass and more preferably 0.01 to 40 parts by mass based on 100 parts by mass of the base polymer (silicon-containing compound obtained by the above method).

When such trivalent or more alcohol is added as the crosslinking agent, the cured film is degraded from a crosslinking agent portion composed of the carbon atoms by the action of the delaminating agent, and the silicon-containing film is collapsed and easily delaminated.

As component (E), the same organic solvent as one used upon producing the silicon-containing compound, preferably the water-soluble organic solvent, particularly monoalkyl ethers of ethylene glycol, diethylene glycol and triethylene glycol, and monoalkyl ethers of propylene glycol, dipropylene glycol, butanediol and pentanediol are used for the thermosetting composition for forming the silicon-containing film of the present invention. Specifically, the organic solvent selected from butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether and ethylene glycol monopropyl ether is used.

In the present invention, the water may be added to the thermosetting composition for forming the silicon-containing film. When the water is added, the silicon-containing compound is hydrated. Thus, the lithography performance is enhanced. The content of the water in the solvent component in the composition is more than 0% by mass and less than 50% by mass, particularly preferably 0.3 to 30% by mass and more preferably 0.5 to 20% by mass. When the amount of each component added is too large, uniformity of the coating film is deteriorated and eye holes occur if the worst happens. Meanwhile, when the added amount is too small, the lithography performance is reduced. Thus, these are not preferable.

The amount of the total solvent including the water is 500 to 100,000 parts by mass and particularly suitably 400 to 50,000 parts by mass based on 100 parts by mass of the base polymer.

In the present invention, the photo acid generator may be added to the thermosetting composition for forming the silicon-containing film. When the entire thermal crosslinking accelerator (B) is not volatilized upon curing by heating or upon exposure, it remains possible that the remaining component (B) in the silicon-containing film affects the pattern profile. To prevent this, by generating the acid in the silicon-containing film upon forming the resist film pattern, the deterioration of the resist film pattern can be prevented. The photo acid generator used in the present invention includes (A-I) an onium salt of the following general formula (P1a-1), (P1a-2) or (P1b),
(A-II) a diazomethane derivative of the following general formula (P2),
(A-III) a glyoxime derivative of the following general formula (P3),
(A-IV) a bis-sulfonic acid derivative of the following general formula (P4),
(A-V) a sulfonate ester of an N-hydroxyimide compound of the following general formula (P5),
(A-VI) a β-keto-sulfonic acid derivative
(A-VII) a disulfonic acid derivative
(A-VIII) a nitrobenzyl sulfonate derivative, and
(A-IX) a sulfonate ester derivative.

(P1a-1)

(P1a-2)

wherein, $R^{101a}$, $R^{101b}$, $R^{101c}$, $R^{101d}$ and $R^{101e}$ each represent straight, branched or cyclic alkyl, alkenyl, oxoalkyl or oxoalkenyl having 1 to 12 carbon atoms, substituted or unsubstituted aryl having 6 to 20 carbon atoms, or aralkyl or aryloxoalkyl having 7 to 12 carbon atoms, and a part or all of hydrogen atoms in these groups may be substituted with alkoxy groups; $R^{101b}$ and $R^{101c}$ may form a ring, when they form the ring, $R^{101b}$ and $R^{101c}$ each represent alkylene groups having 1 to 6 carbon atoms; $K^{1-}$ and $K^{2-}$ represent non-nucleophilic counter ions.

The above $R^{101a}$, $R^{101b}$, $R^{101c}$, $R^{101d}$ and $R^{101e}$ may be the same or different one another, and specifically include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl and adamantyl as alkyl groups. As alkenyl groups, vinyl, allyl, propenyl, butenyl, hexenyl and cyclohexenyl are included. As oxoalkyl groups, 2-oxocyclopentyl and 2-oxocyclohexyl are included, and 2-oxopropyl, 2-cyclopentyl-2-oxoethyl, 2-cyclohexyl-2-oxoethyl and 2-(4-methylcyclohexyl)-2-oxoethyl can be included. As aryl groups, phenyl, naphthyl, alkoxyphenyl groups such as p-methoxyphenyl, m-methoxyphenyl, o-methoxyphenyl, ethoxyphenyl, p-tert-butoxyphenyl and m-tert-butoxyphenyl, alkylphenyl groups such as 2-methylphenyl, 3-methylphenyl, 4-methylphenyl, ethylphenyl, 4-tert-butylphenyl, 4-butylphenyl and dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl are included. As aralkyl groups, benzyl, phenylethyl and phenethyl are included. As aryloxoalkyl groups, 2-aryl-2-oxoethyl groups such as 2-phenyl-2-oxoethyl, 2-(1-naphthyl)-2-oxoethyl and 2-(2-naphthyl)-2-oxoethyl are included. The non-nucleophilic counter ions of $K^-$ include halide ions such as chloride ions and bromide ions, fluoroalkyl sulfonate such as triflate, 1,1,1-trifluoroethane sulfonate and nonafluorobutanesulfonate, arylsulfonate such as tosylate, benzenesulfonate, 4-fluorobenzenesulfonate and 1,2,3,4,5-pentafluorobenzenesulfonate, alkyl sulfonate such as mesylate and butane sulfonate.

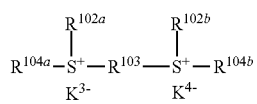
(P1b)

wherein $R^{102a}$ and $R^{102b}$ each represent straight, branched or cyclic alkyl groups having 1 to 8 carbon atoms, $R^{103}$ represents a straight, branched or cyclic alkylene group having 1 to 10 carbon atoms, $R^{104a}$ and $R^{104b}$ each represent 2-oxoalkyl groups having 3 to 7 carbon atoms, and $K^{3-}$ and $K^{4-}$ represent non-nucleophilic counter ions.

The above $R^{102a}$ and $R^{102b}$ specifically include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl and cyclohexylmethyl. $R^{103}$ includes methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene and 1,4-cyclohexanedimethylene. $R^{104a}$ and $R^{104b}$ include 2-oxopropyl, 2-oxocyclopentyl, 2-oxocyclohexyl and 2-oxocycloheptyl. $K^{3-}$ and $K^{4-}$ can include the same ions as those described in the formulae (P1a-1), (P1a-2) and (P1a-3).

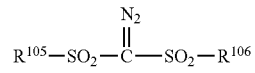
(P2)

wherein $R^{105}$ and $R^{106}$ represent straight, branched or cyclic alkyl or halogenated alkyl groups having 1 to 12 carbon atoms, substituted or unsubstituted aryl or halogenated aryl groups having 6 to 20 carbon atoms, or aralkyl groups having 7 to 12 carbon atoms.

The alkyl group represented by $R^{105}$ and $R^{106}$ includes methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl and adamantyl. The halogenated alkyl group include trifluoromethyl, 1,1,1-trifluoroethyl, 1,1,1-trichloroethyl and nonafluorobutyl. The aryl group includes phenyl, alkoxyphenyl groups such as p-methoxyphenyl, m-methoxyphenyl, o-methoxyphenyl, ethoxyphenyl, p-tert-butoxyphenyl and m-tert-butoxyphenyl, and alkylphenyl groups such as 2-methylphenyl, 3-methylphenyl, 4-methylphenyl, ethylphenyl, 4-tert-butylphenyl, 4-butylphenyl and dimethylphenyl. The halogenated aryl group includes fluorophenyl, chlorophenyl and 1,2,3,4,5-pentafluorophenyl. The aralkyl group includes benzyl and phenethyl.

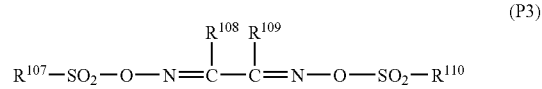
(P3)

wherein $R^{107}$, $R^{108}$, $R^{109}$ and $R^{110}$ represent straight, branched or cyclic alkyl or halogenated alkyl groups having 1 to 12 carbon atoms, aryl or halogenated aryl groups having 6 to 20 carbon atoms, or aralkyl groups having 7 to 12 carbon atoms, $R^{108}$ and $R^{109}$ may be bound each other to form a ring structure, and when they form the ring structure, $R^{108}$ and $R^{109}$ each represent straight or branched alkylene groups having 1 to 6 carbon atoms.

The alkyl group, the halogenated alkyl group, the aryl group, the halogenated aryl group and the aralkyl group represented by $R^{107}$, $R^{108}$, $R^{109}$ and $R^{110}$ include groups which are the same as those described in $R^{105}$ and $R^{106}$. The alkylene group represented by $R^{108}$ and $R^{109}$ includes methylene, ethylene, propylene, butylene and hexylene.

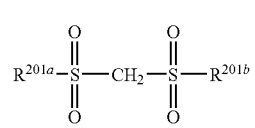
(P4)

wherein $R^{201a}$ and $R^{201b}$ each represent straight, branched or cyclic alkyl, alkenyl, oxoalkyl or oxoalkenyl groups having 1 to 12 carbon atoms, substituted or unsubstituted aryl group having 6 to 20 carbon atoms, or aralkyl or aryloxoalkyl groups having 7 to 12 carbon atoms, and a part or all of hydrogen atoms in these groups may be substituted with alkoxy groups.

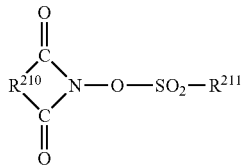
(P5)

wherein $R^{210}$ represents an arylene group having 6 to 10 carbon atoms, an alkylene group having 1 to 6 carbon atoms or an alkenylene group having 2 to 6 carbon atoms, and a part or all of hydrogen atoms in these groups may further be substituted with straight or branched alkyl or alkoxy having 1 to 4 carbon atoms, nitro, acetyl or phenyl groups; $R^{211}$ represents a straight, branched or substituted alkyl, alkenyl or alkoxyalkyl group having 1 to 8 carbon atoms, phenyl or naphthyl group, and a part or all of hydrogen atoms in these groups may further be substituted with alkyl or alkoxy having 1 to 4 carbon atoms; phenyl which may be substituted with alkyl or alkoxy having 1 to 4 carbon atoms, nitro or acetyl; a hetero aromatic group having 3 to 5 carbon atoms; or a chlorine atom or a fluorine atom.

The arylene group represented by $R^{210}$ includes 1,2-phenylene and 1,8-naphthylene, the alkylene represented by $R^{210}$ includes methylene, ethylene, trimethylene, tetramethylene, phenylethylene and norbornane-2,3-diyl, and the alkenylene group represented by $R^{210}$ includes 1,2-vinylene, 1-phenyl-1,2-vinylene and 5-norbornene-2,3-diyl. The alkyl group represented by $R^{211}$ includes those which are the same as in $R^{101a}$ to $R^{101e}$, the alkenyl group represented by $R^{211}$ includes vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl and 7-octenyl, and the alkoxyalkyl group represented by $R^{211}$ includes methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl and methoxyheptyl.

The alkyl group which may be further substituted and has 1 to 4 carbon atoms include methyl, ethyl, propyl, isopropyl, n-butyl, isobutyl and tert-butyl, and the alkoxy group which may be further substituted and has 1 to 4 carbon atoms include methoxy, ethoxy, propoxy, isopropoxy, n-butoxy, isobutoxy and tert-butoxy. The phenyl group which may be substituted with alkyl or alkoxy having 1 to 4 carbon atoms, nitro or acetyl includes phenyl, tolyl, p-tert-butoxyphenyl, p-acetylphenyl and p-nitrophenyl, and the hetero aromatic group having 3 to 5 carbon atoms includes pyridyl and furyl.

Specifically, for example, the following photo acid generators are included. Onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl) sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl (2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl) sulfonium trifluoromethanesulfonate] and 1,2'-naphthylcarbonylmethyltetrahydrothiophenium triflate, diazomethane derivatives such as bis(benzenesulfonyl) diazomethane, bis (p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(iso-propylsulfonyl)diazomethane, bis (tert-butylsulfonyl)diazomethane, bis(n-amylsulfonyl) diazomethane, bis(iso-amylsulfonyl)diazomethane, bis(sec-amylsulfonyl)diazomethane, bis(tert-amylsulfonyl) diazomethane, 1-cyclohexylsulfonyl-1-(tert-butylsulfonyl) diazomethane, 1-cyclohexylsulfonyl-1-(tert-amylsulfonyl) diazomethane, 1-tert-amylsulfonyl-1-(tert-butylsulfonyl) diazomethane, glyoxime derivatives such as bis-o-(p-toluenesulfonyl)-α-dimethyl glyoxime, bis-o-(p-toluenesulfonyl)-α-diphenyl glyoxime, bis-o-(p-toluenesulfonyl)-α-dicyclohexyl glyoxime, bis-o-(p-toluenesulfonyl)-2,3-pentanedione glyoxime, bis-o-(p-toluenesulfonyl)-2-methyl-3,4-pentanedione glyoxime, bis-o-(n-butanesulfonyl)-α-dimethyl glyoxime, bis-o-(n-butanesulfonyl)-α-diphenyl glyoxime, bis-o-(n-butanesulfonyl)-α-dicyclohexyl glyoxime, bis-o-(n-butanesulfonyl)-2,3-pentanedione glyoxime, bis-o-(n-butanesulfonyl)-2-methyl-3,4-pentanedione glyoxime, bis-o-(methanesulfonyl)-α-dimethyl glyoxime, bis-o-(trifluoromethanesulfonyl)-α-dimethyl glyoxime, bis-o-(1,1,1-trifluoroethanesulfonyl)-α-dimethyl glyoxime, bis-o-(tert-butanesulfonyl)-α-dimethyl glyoxime, bis-o-(perfluorooctanesulfonyl)-α-dimethyl glyoxime, bis-o-(cyclohexanesulfonyl)-α-dimethyl glyoxime, bis-o-(benzenesulfonyl)-α-dimethyl glyoxime, bis-o-(p-fluorobenzenesulfonyl)-α-dimethyl glyoxime, bis-o-(p-tert-butylbenzenesulfonyl)-α-dimethyl glyoxime, bis-o-(xylenesulfonyl)-α-dimethyl glyoxime and bis-o-(campharsul-fonyl)-α-dimethyl glyoxime, bis-sulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane and bisbenzenesulfonylmethane, β-keto-sulfonate derivatives such as 2-cyclohexylcarbonyl-2-(p-toluenesulfonyl)propane and 2-isopropylcarbonyl-2-(p-toluenesulfonyl)propane, disulfone derivatives such as diphenyldisulfone and dicyclohexyldisulfone, nitrobenzyl sulfonate derivatives such as p-toluenesulfonate 2,6-dinitrobenzyl and p-toluenesulfonate 2,4-dinitrobenzyl, sulfonate ester derivatives such as 1,2,3-tris(methanesulfonyloxy)benzene, 1,2,3-tris(trifluoromethanesulfonyloxy)benzene and 1,2,3-tris(p-toluenesulfonyloxy)benzene, sulfonate ester derivatives of N-hydroxyimide compounds such as N-hydroxysuccinimide methanesulfonate ester, N-hydroxysuccinimide trifluoromethanesulfonate ester, N-hydroxysuccinimide ethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide 1-octanesulfonate ester, N-hydroxysuccinimide p-toluenesulfonate ester, N-hydroxysuccinimide p-methoxybenzenesulfonate ester, N-hydroxysuccinimide 2-chloroethanesulfonate ester, N-hydroxysuccinimide benzenesulfonate ester, N-hydroxysuccinimide-2,4,6-trimethylbenzenesulfonate ester, N-hydroxysuccinimide 1-naphthalenesulfonate ester, N-hydroxysuccinimide 2-naphthalenesulfonate ester, N-hydroxy-2-phenylsuccinimide methanesulfonate ester, N-hydroxymaleimide methanesulfonate ester, N-hydroxymaleimide ethanesulfonate ester, N-hydroxy-2-phenylmaleimide methanesulfonate ester, N-hydroxyglutarimide methanesulfonate ester, N-hydroxyglutarimide benzenesulfonate ester, N-hydroxyphthalimide methanesulfonate ester, N-hydroxyphthalimide benzenesulfonate ester, N-hydroxyphthalimide trifluoromethanesulfonate ester, N-hydroxyphthalimide p-toluenesulfonate ester, N-hydroxynaphthalimide methanesulfonate ester, N-hydroxynaphthalimide benzenesulfonate ester, N-hydroxy-5-norbornene-2,3-dicarboxyimide methanesulfonate ester, N-hydroxy-5-norbornene-2,3-dicarboxyimide trifluoromethanesulfonate ester and N-hydroxy-5-norbornene-2,3-dicarboxyimide p-toluenesulfonate ester are included.

Among them, in particular, the onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate and 1,2'-naphthylcarbonylmethyltetrahydrothiophenium triflate, the diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane and bis(tert-butylsulfonyl)diazomethane, the glyoxime derivatives such as bis-o-(p-toluenesulfonyl)-α-dimethyl glyoxime and bis-o-(n-butanesulfonyl)-α-dimethyl glyoxime, the bis-sulfone derivatives such as bisnaphthylsulfonylmethane, the sulfonate ester derivatives of the N-hydroxyimide compounds such as N-hydroxysuccinimide methanesulfonate ester, N-hydroxysuccinimide trifluoromethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide p-toluenesulfonate ester, N-hydroxynaphthalimide methanesulfonate ester and N-hydroxynaphthalimide benzenesulfonate ester are preferably used.

The above photo acid generator can be used alone or in combination of two or more. The amount of the acid generator to be added is preferably 0.01 to 50 parts by mass and more preferably 0.05 to 40 parts by mass based on 100 parts by mass of the base polymer (the silicon-containing compound obtained by the above method).

Further a surfactant can be compounded if necessary in the present invention. Here, the surfactant is preferably nonionic, and includes perfluoroalkyl polyoxyethylene ethanol, alkyl fluoride ester, perfluoroalkylamine oxide, perfluoroalkylethylene oxide adducts and fluorine-containing organosiloxane-based compounds. For example, FLUORAD "FC-430", "FC-431" and "FC-4430" (produced by Sumitomo 3M Ltd.), Surflon "S-141", "S-145", "KH-10", "KH-20", "KH-30" and "KH-40" (produced by Asahi Glass Co., Ltd.), Unidain "DS-401", "DS-403" and "DS-451" (produced by Daikin Industries, Ltd.), Megafac "F-8151" (produced by Dainippon Ink And Chemicals, Incorporated), and "X-70-092" and "X-70-093" (produced by Shin-Etsu Chemical Co., Ltd.) can be included. Preferably FLUORAD "FC-4430", "KH-20", "KH-30" and "X-70-093" are included.

The amount of the surfactant to be added can be the ordinary amount as long as this does not prevent the effects of the present invention, and is preferably 0 to 10 parts by mass and particularly 0 to 5 parts by mass based on 100 parts by mass of the base polymer.

The present inventor also studied extensively in order to inhibit the condensation of the remaining silanol groups one another contained in the silicon-containing compound around room temperature, and has found that the condensation around room temperature is inhibited and the storage stability of the composition is exponentially enhanced by adding as a stabilizer monovalent or bivalent or more alcohol having cyclic ether as the substituent. In particular, it has been found that the ether compound represented by the following structure can be added. Such a compound can include compounds shown below.

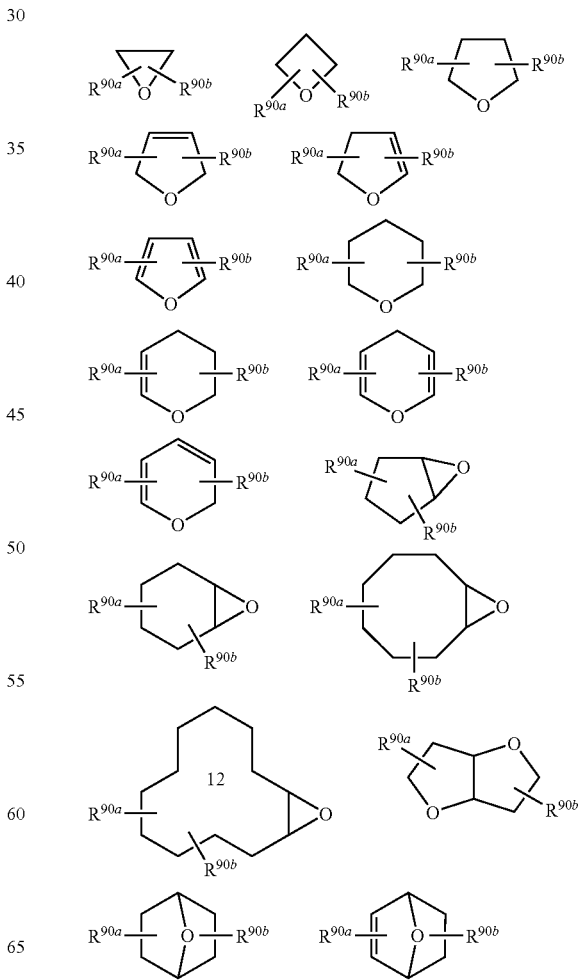

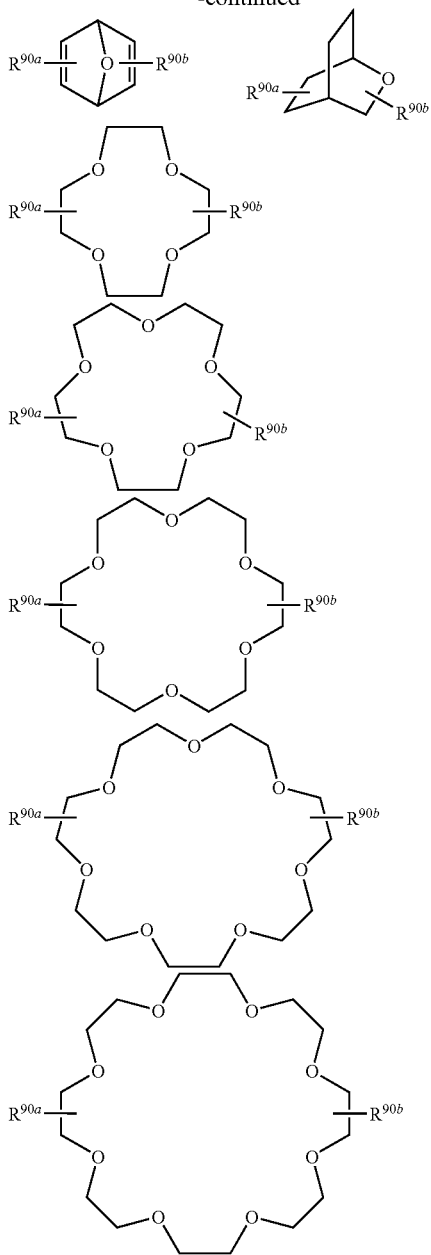

Here, $R^{90a}$ represents a hydrogen atom, a straight, branched or cyclic monovalent hydrocarbon group, $R^{91}O—(CH_2CH_2O)_{n1}—(CH_2)_{n2}—$ (here $0 \le n1 \le 5$, $0 \le n2 \le 3$, $R^{91}$ is a hydrogen atom or a methyl group), or $R^{92}O—[CH(CH_3)CH_2O]_{n3}—(CH_2)_{n4}—$ (here $0 \le n3 \le 5$, $0 \le n4 \le 3$, $R^{92}$ is a hydrogen atom or a methyl group), $R^{90b}$ represents a hydroxyl group, a straight, branched or cyclic monovalent hydrocarbon group having one or two or more hydroxyl groups and having 1 to 10 carbon atoms, $HO—(CH_2CH_2O)_{n5}—(CH_2)_{n6}—$ (here $1 \le n5 \le 5$, $1 \le n6 \le 3$) or $HO—[CH(CH_3)CH_2O]_{n7}—(CH_2)_{n8}—$ (here $1 \le n7 \le 5$, $1 \le n8 \le 3$).

The silicon-containing film formed from the thermosetting composition for forming the silicon-containing film effective as the etching mask of the present invention can be produced on the substrate by a spin coating method as is the case with the photoresist film. After spin coating, it is desirable to evaporate the solvent and bake the film in order to prevent mixing with the photoresist film formed on the silicon-containing film and accelerate the crosslinking reaction. The baking is preferably performed in the range of 50 to 500° C. in the range of 10 to 300 seconds. The particularly preferable temperature range depends on the structure of the produced device, and the temperature at 400° C. or below is preferable in order to reduce thermal damage to the device.

Here, in the present invention, the pattern can be formed by obtaining the substrate where the organic film is formed on the processing substrate, the silicon-containing film is formed from the thermosetting composition for forming the silicon-containing film on the organic film and the photoresist film is formed on this silicon-containing film.

In this case, a processing layer in the processing substrate can include an insulation film having a low dielectric constant having a k value of 3 or less, an insulation film primarily processed and having the low insulation constant, a nitrogen and/or oxygen-containing inorganic film and a metal film.

More particularly, the processing substrate can be one where the processing layer (processing portion) has been formed on a base substrate. The base substrate is not particularly limited, and Si, amorphous silicon (α-silicon), p-Si, $SiO_2$, SiN, SiON, W, TiN, or Al which is a material different from the processing layer may be used. As the processing layer, Si, $SiO_2$, SiN, SiON, p-Si, α-Si, W, W—Si, Al, Cu, and Al—Si, and various low dielectric films and etching stopper film thereof are used, and they are typically formed into a thickness of 50 to 10,000 nm and particularly 100 to 5,000 nm.

In the present invention, the commercially available organic antireflection film may be formed between the silicon-containing film formed from the thermosetting composition for forming the silicon-containing film and the photoresist film formed on the silicon-containing film. At that time, the organic antireflection film is the compound having the aromatic substituent. This organic antireflection film should not be a etch loading to the photoresist film when the pattern in the photoresist film is transferred by dry etching onto the silicon-containing film. For example, if the film thickness of the organic antireflection film is 80% or less and preferably 50% or less based on the thickness of the photoresist film, the loading upon dry etching becomes vary small.

In this case, it is preferable to control the organic antireflection film so that minimum reflection is 2% or less, preferably 1% or less and more preferably 0.5% or less.

When the substrate of the present invention is used for the exposure process by ArF excimer laser light, as the photoresist film formed on the silicon-containing film, the ordinary photoresist composition for the ArF excimer laser light can be used. Many candidates have been already known publicly as the photoresist composition for the ArF excimer laser light. The chemically amplified positive resist composition is composed mainly of the resin which becomes soluble in an alkali aqueous solution by degrading an acid labile group with the action of the acid, the photo acid generator and a basic substance for controlling the diffusion of the acid. The chemically amplified negative composition is composed mainly of the resin which reacts with the crosslinking agent by the action of the acid to become insoluble in the alkali aqueous solution, the photo acid generator, the crosslinking agent and the basic substance for controlling the diffusion of the acid. Their properties are different depending on the resin used. Broadly dividing the already publicly known resins, poly (meth)acryl-based resins, COMA (Cyclo Olefin Maleic Anhydride)-based resins, COMA-(meth)acryl hybrid-based resins, ROMP (Ring Opening Methathesis Polymerization)-based resins and polynorbornene-based resins are available.

Among them, the resist composition using the poly(meth) acryl-based resin is more excellent in resolution performance than other resins because the etching resistance is assured by introducing an alicyclic skeleton into its side chain.

The many composition for the ArF excimer laser using poly(meth)acryl-based resin have been known publicly. The polymer as the positive composition is composed by combining a unit for assuring the etching resistance, a unit which degrades by the action of the acid to become alkali-soluble and a unit for assuring an adhesiveness, or the combination including a unit combining two or more of the above functions in some cases. Among them, as the unit in which the alkali solubility is changed with acid, (meth)acrylate ester having the acid labile group having an adamantane skeleton (Japanese Patent Laid-open (kokai) No. H9-73173) and (meth)acrylate ester having the acid unstable group having a norbornane skeleton or a tetracyclodecane skeleton (Japanese Patent Laid-open (kokai) No. 2003-84438) are particularly preferably used because they give the high resolution and the high etching resistance. Also as the unit for assuring the adhesiveness, (meth)acrylate ester having a norbornane side chain having a lactone ring (WO00/1684), (meth)acrylate ester having an oxanorbornane side chain (Japanese Patent Laid-open (kokai) No. 2000-159758) and (meth)acrylate ester having a hydroxyadamantyl side chain (Japanese Patent Laid-open (kokai) No. H8-12626) can be particularly preferably used because they give the good etching resistance and the high resolution. However, it has become problematic that the polymer containing fluorine therein reduces the etching resistance. The silicon-containing film for the etching mask formed from the thermosetting composition for forming silicon-containing film of the present invention can be particularly effectively used for such an organic resist composition in which the etching resistance is hardly assured.

Additionally, an acid generator and a basic compound are contained in the resist composition for the ArF excimer laser containing the above polymer, as the acid generator, almost the same one as one which can be added in the composition for forming the silicon-containing film of the present invention can be used, and in particular, the onium salt is advantageous in terms of sensitivity and resolution. The many basic substances are publicly known, exemplified in Japanese Patent Laid-open (kokai) No. 2005-146252 recently published, and the basic substance can be advantageously selected from them.

The silicon-containing film for the etching mask is formed using the thermosetting composition for forming the silicon-containing film of the present invention, subsequently, the photoresist film is formed thereon using a photoresist composition solution, and the spin coating method is preferably used as is the case with the silicon-containing film layer. After spin-coating the resist composition, prebaking is performed preferably at 80 to 180° C. for 10 to 300 seconds. Subsequently, the exposure, post-exposure baking (PEB) and development are performed to obtain the resist film pattern.

The silicon-containing film formed using the thermosetting composition for forming the silicon-containing film of the present invention is etched using chlorofluorocarbon-based gas, nitrogen gas or carbon dioxide gas. The silicon-containing film formed using the thermosetting composition for forming the silicon-containing film of the present invention is characterized in that the etching speed to the above gas is fast and a film thickness loss in the photoresist film formed over the silicon-containing film is small.

In the multilayer resist process used in the present invention, the organic film as the resist lower layer film is provided between the silicon-containing film formed using the thermosetting composition for forming the silicon-containing film of the present invention and the processing substrate. When the lower layer film is used as the etching mask for the processing substrate, it is preferable that the resist lower layer film is the organic film having the aromatic skeleton, but when the resist lower layer film is the sacrificial layer, the lower layer film may be not only the organic film but also a silicon-containing material containing 15% by mass or less silicon.

In the multilayer resist process used in the present invention, when the organic film is used as the lower layer film which becomes the etching mask for the processing substrate, the organic film transfers the resist film pattern where the pattern has been formed to the silicon-containing film and subsequently transfers the pattern once more, and the property that the etching processing can be performed under the etching condition where the silicon-containing film exhibits the high etching resistance as well as the property of having the high etching resistance for etching the processing substrate are required for the organic film.

As the organic film having the aromatic skeleton as such a lower layer film, many ones have been already known publicly as the lower layer film for the trilayer resist method, or a bilayer resist method using a silicon resist composition. 4,4'-(9H-fluorene-9-ilidene)bisphenol novolak resins (molecular weight: 11,000) described in Japanese Patent Laid-open (kokai) No. 2005-128509, and additionally many resins including the novolak resins are known publicly as the resist lower layer film materials for the bilayer resist method and the trilayer resist method, and any of them can be used. When the higher heat resistance than ordinary novolak is desired, a polycyclic skeleton such as 4,4'-(9H-fluorene-9-ilidene) bisphenol novolak resin can also be inserted, and furthermore a polyimide-based resin can be selected (e.g., Japanese Patent Laid-open (kokai) No. 2004-153125).

The above organic film can be formed on the substrate using a composition solution by the same spin coating method as in the photoresist composition. After forming the organic film by the spin coating method, it is desirable to bake the film in order to evaporate the organic solvent. The baking is preferably performed at 80 to 300° C. for 10 to 300 seconds.

The thickness of the organic film as the lower layer film is not particularly limited, varies depending on the etching processing condition, and is 10 nm or more, particularly 50 nm or more and preferably 50,000 nm or less. The thickness of the silicon-containing film formed using the thermosetting composition for forming the silicon-containing film of the present invention is preferably 1 nm or more and 200 nm or less, and the thickness of the photoresist film formed on the silicon-containing film is preferably 1 nm or more and 300 nm or less.

The trilayer resist method using the silicon-containing film formed using the thermosetting composition for forming the silicon-containing film of the present invention is for example as follows. In this process, the organic film is first made on the processing substrate by the spin coating method. Since this organic film acts as the mask when the processing substrate is etched, it is desirable to have the high etching resistance. It is also required not to be mixed with silicon-containing film for the etching mask for the upper layer. Thus, it is desirable to be crosslinked with heating or the acid after being spin-coated. The silicon-containing film for the etching mask obtained from the composition of the present invention, the organic antireflection film and the photoresist film are formed thereon by the above method. In the photoresist film, the resist film pattern can be obtained by performing the pattern exposure according to the standard method and using the light source depending on the photoresist film, e.g., KrF excimer laser light, ArF excimer laser light or $F_2$ laser light, treating with heat under the condition depending on the individual resist film, and subsequently developing using the developer. Subsequently, using this resist film pattern as the etching mask, the etching by the dry etching with, under the etching condition in which the etching speed in the silicon-containing film is predominantly higher than that in the organic film, for example, the fluorine gas plasma is performed. By giving the etching processing to the above organic antireflection film and the silicon-containing film, it is possible to obtain the silicon-containing film pattern nearly without undergoing the effect of the pattern change due to side etching of the photoresist film. Subsequently, the etching processing is given to the substrate having the silicon-containing film pattern to which the resist film pattern obtained above has been transferred, by performing the reactive dry etching under the dry etching condition in which the etching speed in the organic film is predominantly higher, e.g., the dry etching with the gas plasma containing oxygen or the gas plasma containing hydrogen-nitrogen, thereby, the etching processing is given to the organic film. The organic film pattern is obtained by this etching process, but the photoresist layer in an uppermost layer is usually lost. Furthermore, using the organic film obtained here as the etching mask, the etching processing with high accuracy can be given to the processing substrate by using, for example, the fluorine-based dry etching or the chlorine-based dry etching for the processing substrate. In the above examples, the organic antireflection film is formed if necessary, and the organic antireflection film is not always used in some cases.

EXAMPLES

The present invention will be described specifically with reference to Synthesis Examples, Examples and Comparative Examples, but the present invention is not limited by these descriptions.

Synthesis of Silicon-Containing Compounds 1 to 5

Synthesis Example 1

In a 1,000 mL glass flask, 200 g of methanol, 200 g of ion-exchange water and 1 g of 35% hydrochloric acid were placed, and a mixture of 50 g of tetraethoxysilane, 100 g of methyltrimethoxysilane and 10 g of phenyltrimethoxysilane were added thereto at room temperature. Just as it was, hydrolysis and condensation were performed at room temperature for 8 hours, then 300 mL of propylene glycol monoethyl ether was added, and the reaction mixture was concentrated under reduced pressure to yield 300 g of a solution of a silicon-containing compound 1 propylene glycol monoethyl ether (polymer concentration: 21%). A molecular weight of this in terms of polystyrene was measured, and was Mw=2,000.

Synthesis Example 2

300 g of a solution of a silicon-containing compound 2 propylene glycol monoethyl ether (polymer concentration: 19%) was yielded in the same way as Synthesis Example 1, except that the mixture of 50 g of tetraethoxysilane, 100 g of methyltrimethoxysilane and 10 g of phenyltrimethoxysilane was changed to 100 g of methyltrimethoxysilane and 20 g of phenyltrimethoxysilane. The molecular weight of this in terms of polystyrene was measured, and was Mw=3,000.

Synthesis Example 3

300 g of a solution of a silicon-containing compound 3 in butanediol monomethyl ether (polymer concentration: 20%) was yielded in the same way as Synthesis Example 1, except that 60 g of methanol, 200 g of ion-exchange water, 1 g of 35% hydrochloric acid, 50 g of tetraethoxysilane, 100 g of methyltrimethoxysilane, 10 g of phenyltrimethoxysilane and propylene glycol monoethyl ether were changed to 260 g of the ion-exchange water, 5 g of 65% nitric acid, 70 g of tetramethoxysilane, 70 g of methyltrimethoxysilane, 10 g of phenyltrimethoxysilane and butanediol monomethyl ether. The molecular weight of this in terms of polystyrene was measured, and was Mw=2,500.

Synthesis Example 4

In a 1,000 glass flask, 260 g of the ion-exchange water and 1 g of 35% hydrochloric acid were placed and the mixture of 70 g of tetramethoxysilane, 25 g of methyltrimethoxysilane, 25 g of a silane compound of the following formula [i] and 10 g of phenyltrimethoxysilane was added thereto at room temperature. Just as it was, hydrolysis and condensation were performed at room temperature for 8 hours, and then by-product methanol was distilled off under reduced pressure. Thereto, 800 mL of ethyl acetate and 300 mL of propylene glycol monopropyl ether were added to separate an aqueous layer. To a remaining organic layer, 100 mL of the ion-exchange water was added, stirred and left stand to separate the liquids. This was repeated three times. To a remaining organic layer, 200 mL of propylene glycol monopropyl ether was added, and the solution was concentrated under reduced pressure to yield 300 g of a solution of a silicon-containing compound 4 in propylene glycol monopropyl ether (polymer concentration: 20%). Chloro ion was analyzed in the obtained solution by ion chromatography, and was not detected. The molecular weight of this in terms of polystyrene was measured, and was Mw=1,800.

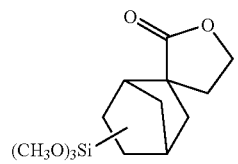

[i]

Synthesis Example 5

In a 1,000 glass flask, 200 g of ethanol, 100 g of the ion-exchange water and 3 g of methanesulfonic acid were placed, and the mixture of 40 g of tetramethoxysilane, 10 g of methyltrimethoxysilane, 50 g of a silane compound of the following formula [ii] and 10 g of phenyltrimethoxysilane was added thereto at room temperature. Just as it was, hydrolysis and condensation were performed at room temperature for 8 hours, and then by-product methanol was distilled off under reduced pressure. Thereto, 800 mL of ethyl acetate and 300 mL of ethylene glycol monopropyl ether were added to separate the aqueous layer. To the remaining organic layer, 100 mL of the ion-exchange water was added, stirred and left stand to separate the liquids. This was repeated three times. To a remaining organic layer, 200 mL of ethylene glycol monopropyl ether was added, and the solution was concentrated under reduced pressure to yield 300 g of a solution of a silicon-containing compound 5 in ethylene glycol monopropyl ether (polymer concentration: 20%). Methanesulfonate ion was analyzed in the obtained solution by ion chromatography, and it was found that 99% of the methanesulfonate ion used in the reaction was removed. The molecular weight of this in terms of polystyrene was measured, and was Mw=2,100.

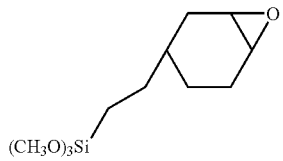

[ii]

Examples 1 to 7, Comparative Examples 1 and 2

Each thermosetting composition for forming a silicon-containing film was prepared by mixing the silicon-containing compound 1 to 5 (A) obtained in the above Synthesis Examples, a thermal crosslinking accelerator (B), a monovalent or bivalent or more organic acid (C) having 1 to 30 carbon atoms, trivalent or more alcohol (D) as the crosslinking agent, an organic solvent (E), water and other additives at a ratio shown in Table 1, and filtrating the mixture through a 0.1 μm filter made from a fluorine resin, and designated as Sol. 1 to 9, respectively.

TABLE 1

Composition for forming silicon-containing film

| | No. | Silicon-containing compound (Parts by mass) | Thermal crosslinking accelerator (Parts by mass) | Organic acid (Parts by mass) | Organic solvent (Parts by mass) | Cross linking agent (Parts by mass) | Water (Parts by mass) | Other Additive (Parts by mass) |
|---|---|---|---|---|---|---|---|---|
| EXP 1 | Sol. 1 | Silicon-containing compound 1 (4.0) | TPSOAc (0.04) | Maleic acid (0.04) | Propylene glycol monoethyl ether (100) | Cross linking agent 1 (5) | Water (10) | None |
| EXP 2 | Sol. 2 | Silicon-containing compound 2 (4.0) | TPSOH (0.04) | Oxalic acid (0.02) | Propylene glycol monoethyl ether (100) | Cross linking agent 2 (5) | Water (5) | None |
| EXP 3 | Sol. 3 | Silicon-containing compound 3 (4.0) | TPSCl (0.04) TMAOAc (0.003) | Maleic acid (0.01) | Butanediol monomethyl ether (100) | Cross linking agent 3 (5) | Water (5) | None |
| EXP 4 | Sol. 4 | Silicon-containing compound 4 (4.0) | TPSMA (0.04) TMAOAc (0.003) | Maleic acid (0.01) Oxalic acid (0.01) | Propylene glycol monopropyl ether (100) | Cross linking agent 4 (5) | Water (5) | None |
| EXP 5 | Sol. 5 | Silicon-containing compound 5 (4.0) | TPSN (0.04) | Maleic acid (0.01) Oxalic acid (0.01) | Ethylene glycol monopropyl ether (100) | Cross linking agent 5 (5) | Water (5) | None |
| EXP 6 | Sol. 6 | Silicon-containing compound 1 (4.0) | TPSMA (0.04) | Maleic acid (0.01) | Propylene glycol monoethyl ether (100) | Cross linking agent 1 (5) | Water (3) | TPSNf (0.02) |
| EXP 7 | Sol. 7 | Silicon-containing compound 1 (4.0) | TPSOAc (0.04) | Maleic acid (0.01) | Propylene glycol monoethyl ether (100) | Cross linking agent 1 (5) | Water (0) | None |
| COM EXP 1 | Sol. 8 | Silicon-containing compound 1 (4.0) | TPSOAc (0.04) | Maleic acid (0.01) | Propylene glycol monoethyl ether (100) | None | Water (5) | None |
| COM EXP 2 | Sol. 9 | Silicon-containing compound 1 (4.0) | None | Maleic acid (0.01) | Propylene glycol monoethyl ether (100) | Cross linking agent 1 (5) | Water (5) | None |

The thermal crosslinking accelerator (B), the photo acid generator and trivalent or more alcohol (D) as the crosslinking agent used in the above Examples 1 to 7 and Comparative Examples 1 and 2 are shown below.

TPSOAc: Triphenylsulfonium acetate (photodegradable thermal crosslinking accelerator)

TPSOH: Triphenylsulfonium hydroxide (photodegradable thermal crosslinking accelerator)

TPSCl: Triphenylsulfonium chloride (photodegradable thermal crosslinking accelerator)

TPSMA: Mono(triphenylsulfonium) maleate (photodegradable thermal crosslinking accelerator)

TPSN: Triphenylsulfonium nitrate (photodegradable thermal crosslinking accelerator)

TMAOAc: Tetramethylammonium acetate (non-photodegradable thermal crosslinking accelerator)

TPSNf: Triphenylsulfonium nonafluorobutanesulfonate (photo acid generator).

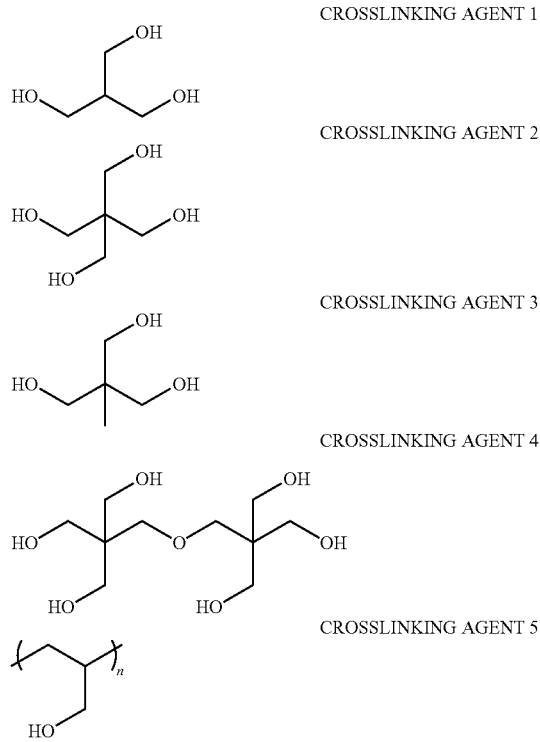

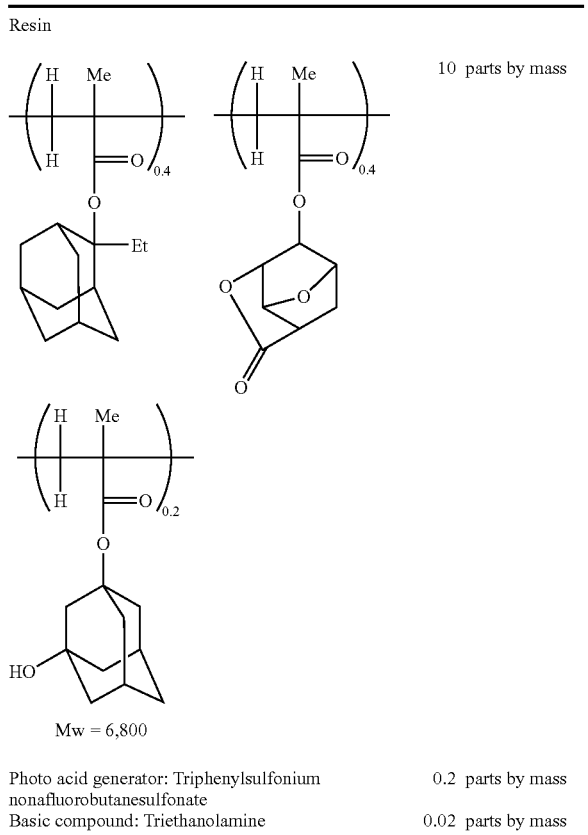

First, a 4,4'-(9H-fluorene-9-ilidene)bisphenol novolak resin (molecular weight: 11,000) (Japanese Patent Laid-Open (kokai) No. 2005-128509)-containing composition (resin: 28 parts by mass, solvent: 100 parts by mass) as an organic film material as a resist lower layer film was spin-coated on an Si wafer, and a film was formed by heating at 200° C. for one minute to form an organic film as the lower layer film having a film thickness of 300 nm. As this organic film material, in addition to the above, many resins including the novolak resins are known publicly as the resist lower layer material in the multilayer resist process, and any of them can be used.

Subsequently a silicon-containing film having the film thickness of 100 nm was formed by spin-coating Sol. 1 to 9 and forming a film by heating at 200° C. for one minute.

Furthermore, in order to form the photoresist film to be formed on the silicon-containing film, a resist composition for the exposure to ArF excimer laser light was prepared by dissolving the following ones in a PGMEA (propylene glycol monomethyl ether acetate) solution containing 0.1% by mass of FC-430 (produces by Sumitomo 3M Ltd.) and filtrating the solution through a 0.1 μm filter made from the fluorine resin.

This composition was applied on the silicon-containing film, and the photoresist film having the film thickness of 200 nm was formed by baking at 130° C. for 60 seconds.

Then, the film was exposed to the light from an ArF exposure apparatus (S305B, NA0. 68, σ0.85, ⅔ cycle lighting, Cr mask, produced by Nikon Corporation), baked (PEB) at 110° C. for 90 seconds and developed by an aqueous solution of 2.38% by mass of tetramethylammonium hydroxide (TMAH) to obtain a positive pattern. Results of observing a 90 nmL/S pattern profile in the obtained pattern are shown in Table 2.

TABLE 2

| | Pattern profile | |
|---|---|---|
| | No. | Pattern profile |
| Example 1 | Sol. 1 | Good |
| Example 2 | Sol. 2 | Good |
| Example 3 | Sol. 3 | Good |
| Example 4 | Sol. 4 | Good |
| Example 5 | Sol. 5 | Good |
| Example 6 | Sol. 6 | Good |
| Example 7 | Sol. 7 | Good |
| Comparative Example 1 | Sol. 8 | Good |
| Comparative Example 2 | Sol. 9 | Pattern collapse |

In any of Examples, the pattern having no footing, no undercut and no intermixing profile around the substrate was obtained. Resist pattern collapse occurred in Comparative Example 2.

(Dry Etching Resistance Test)

Then, a test for the dry etching resistance was performed. Each of the above compositions Sol. 1 to 9 was spin-coated and heated at 200° C. for one minute to form each of silicon-containing films Film 1 to 9 having the film thickness of 100 nm. Using these films, the organic film and the photoresist film, the etching test was performed under the following etching condition (1). The results are shown in Table 3. The etching speed of the silicon-containing film is significantly faster compared with the organic film and the photoresist film, thus, it is possible to transfer the pattern to the silicon-containing film using the resist pattern as the etching mask.
(1) Etching test by $CHF_3/CF_4$-based gas Apparatus: Dry etching apparatus TE-8500P supplied from Tokyo Electron Ltd.
Etching condition (1)
Chamber pressure: 40.0 Pa
RF power: 1,300 W
Gap: 9 mm
$CHF_3$ gas flow rare: 30 mL/minute
$CF_4$ gas flow rate: 30 mL/minute
Ar gas flow rate: 100 mL/minute
Treatment time period: 10 seconds

TABLE 3

$CHF_3/CF_4$-based gas dry etching speed

| | Composition for forming silicon-containing film | Silicon-containing film | $CHF_3/CF_4$-based gas dry etching speed (nm/min) |
|---|---|---|---|
| Example 1 | Sol. 1 | Film 1 | 400 |
| Example 2 | Sol. 2 | Film 2 | 500 |
| Example 3 | Sol. 3 | Film 3 | 450 |
| Example 4 | Sol. 4 | Film 4 | 250 |
| Example 5 | Sol. 5 | Film 5 | 200 |
| Example 6 | Sol. 6 | Film 6 | 500 |
| Example 7 | Sol. 7 | Film 7 | 400 |
| Comparative Example 1 | Sol. 8 | Film 8 | 400 |
| Comparative Example 2 | Sol. 9 | Film 9 | 400 |
| Photoresist film | — | — | 120 |
| Organic film | — | — | 85 |

Subsequently, as shown in Table 4, a dry etching speed of $O_2$-based gas was examined under the etching condition (2) shown below. The etching speed of the silicon-containing film is significantly more slowly, Compared with the organic film and the photoresist film, thus, the pattern can be transferred to the organic film using the silicon-containing film as the etching mask.
Etching condition (2)
Chamber pressure: 60.0 Pa
RF power: 600 W
Ar gas flow rate: 40 mL/minute
$O_2$ gas flow rate: 60 mL/minute
Gap: 9 mm
Treatment time period: 20 seconds

TABLE 4

$O_2$-based gas dry etching speed

| | Silicon-containing film | $O_2$-based gas dry etching speed (nm/min) |
|---|---|---|
| Example 1 | Film 1 | 2 |
| Example 2 | Film 2 | 1 |
| Example 3 | Film 3 | 2 |
| Example 4 | Film 4 | 10 |
| Example 5 | Film 5 | 15 |
| Example 6 | Film 6 | 2 |
| Example 7 | Film 7 | 2 |
| Comparative Example 1 | Film 8 | 2 |
| Comparative Example 2 | Film 9 | 2 |
| Photoresist film | — | 250 |
| Organic film | — | 210 |

(Delamination Test)

Further a delamination test was performed. The silicon-containing film formed from each of the compositions for forming the silicon-containing film obtained above (Sol. 1 to 9) was treated in a sulfuric acid/hydrogen peroxide (3:1) mixture at 90° C. to confirm a delamination performance

TABLE 5

Results of delamination

| | Composition name | Characterization after delamination |
|---|---|---|
| Example 1 | Sol. 1 | No residual coating film on wafer |
| Example 2 | Sol. 2 | No residual coating film on wafer |
| Example 3 | Sol. 3 | No residual coating film on wafer |
| Example 4 | Sol. 4 | No residual coating film on wafer |
| Example 5 | Sol. 5 | No residual coating film on wafer |
| Example 6 | Sol. 6 | No residual coating film on wafer |
| Example 7 | Sol. 7 | No residual coating film on wafer |
| Comparative Example 1 | Sol. 8 | Could not be delaminated |
| Comparative Example 2 | Sol. 9 | No residual coating film on wafer |

From the results in Table 5, the delamination by the sulfuric acid/hydrogen peroxide mixture was possible in any of Examples as long as trivalent or more alcohol was contained as the crosslinking agent. Meanwhile, the silicon-containing film in Comparative Example 1 could not be delaminated.

Further, a storage stability test was performed. The compositions for forming the silicon-containing film obtained above (Sol. 1 to 9) were stored at 30° C. for 3 months, then the spin-coating was carried out again by the above method, and it was examined whether a film forming property was changed or not. The results are shown in Table 6.

TABLE 6

Results of storage stability

| | Composition for forming silicon-containing film | Results of stability test |
|---|---|---|
| Example 1 | Sol. 1 | No change in film thickness and pattern profile |
| Example 2 | Sol. 2 | No change in film thickness and pattern profile |
| Example 3 | Sol. 3 | No change in film thickness and pattern profile |
| Example 4 | Sol. 4 | No change in film thickness and pattern profile |
| Example 5 | Sol. 5 | No change in film thickness and pattern profile |
| Example 6 | Sol. 6 | No change in film thickness and pattern profile |
| Example 7 | Sol. 7 | No change in film thickness and pattern profile |

TABLE 6-continued

Results of storage stability

| Composition for forming silicon-containing film | Results of stability test |
|---|---|
| Comparative Example 1 | Sol. 8 | No change in film thickness and pattern profile |
| Comparative Example 2 | Sol. 9 | Increased film thickness by 15%, Delaminated pattern profile |

From the results in Table 6, the storage stability for 3 months or more at 30° C. and for 6 months or more in terms of room temperature was confirmed in any of the compositions for forming the silicon-containing film in Examples. In Comparative Example 1, no change of the film thickness was observed, but the delamination occurred in the pattern profile. In Comparative Example 2, the film thickness was increased and the delamination occurred in the pattern profile.

From the above, it has been confirmed that when the composition of the present invention, i.e., the thermosetting composition for forming the silicon-containing film is used, even if the high NA exposing machine is used, the silicon-containing film where the good resist film pattern is formed, which can give the sufficient selection ratio between the organic film of the lower layer and the photoresist film of the upper layer as the dry etching mask, whose storage stability is good and which can be delaminated in wet delamination by a delamination solution can be obtained.

The present invention is not limited to the above embodiments. The above embodiments are exemplifications, and any of those having substantially the identical constitution to technical ideas described in claims of the present invention and having the same action effects is contained in the technical scope of the present invention.

What is claimed is:

1. A thermosetting silicon-containing intermediate-film-forming composition for a multilayer resist process used in lithography, the thermosetting silicon-containing intermediate-film-forming composition comprising:

(A) a silicon-containing compound obtained by hydrolyzing and condensing a hydrolyzable silicon compound using an acid as a catalyst;

(B) one or more thermal crosslinking accelerators represented by the following general formula (1) or (2):

wherein L represents lithium, sodium, potassium, rubidium or cesium, X represents a hydroxyl group or a monovalent or polyvalent organic acid group having 1 to 30 carbon atoms, a represents an integer of 1 or more, b represents an integer of 0 or 1 or more, and a+b is a valence of the hydroxyl group or the organic acid group;

wherein M represents sulfonium, iodonium or ammonium, A represents a hydroxyl group or a monovalent or polyvalent organic acid group having 1 to 30 carbon atoms or non-nucleophilic counter ion, a' represents an integer of 1 or more, b' represents an integer of 0 or 1 or more, and a'+b' is a valence of the hydroxyl group, the organic acid group or the non-nucleophilic counter ion;

(C) a monovalent or polyvalent organic acid having 1 to 30 carbon atoms;

(D) an alcohol having a formula selected from the following group:

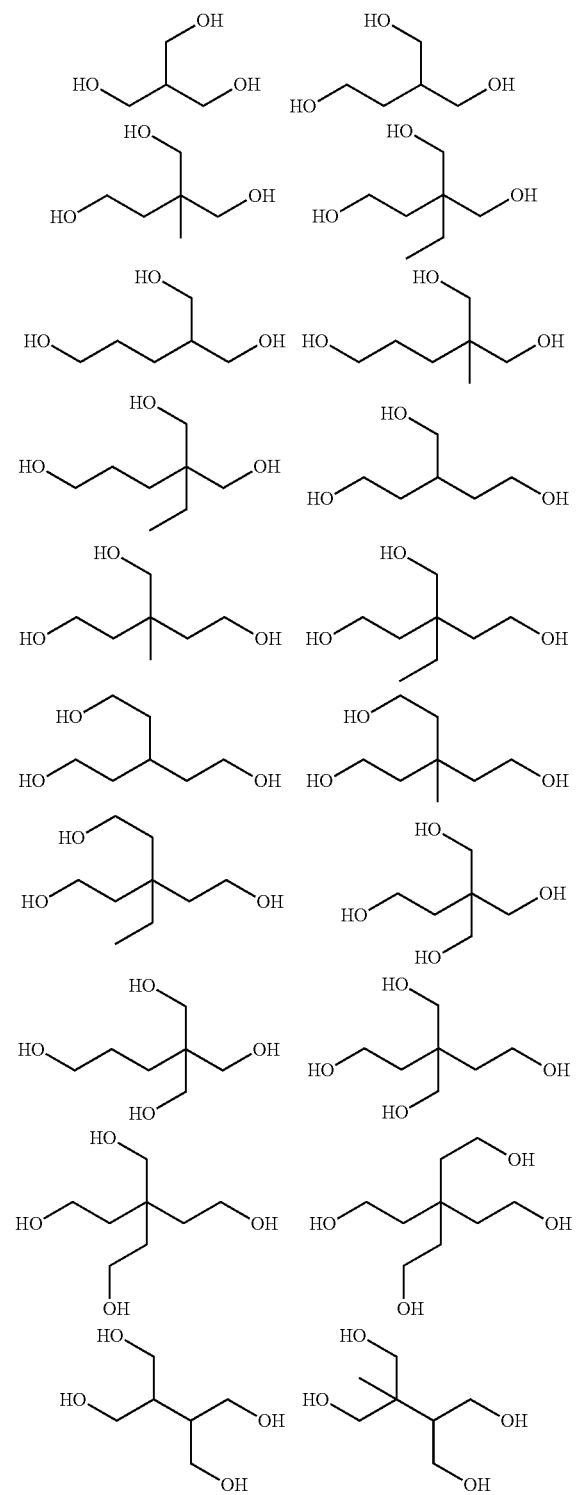

-continued

[chemical structures]

where:
- X' represents a hydrogen or a methyl;
- R' represents an organic group having one or more carbon atoms and having methylene as the carbon at the hydroxyl group side; and
- n represents an integer of at least 3 and less than 100; and (E) an organic solvent;

wherein the thermosetting silicon-containing intermediate-film-forming composition is a composition for forming an intermediate film in a multilayer resist having 3 or more layers.

2. The thermosetting silicon-containing intermediate-film-forming composition according to claim 1, wherein the silicon-containing compound is obtained by hydrolyzing and condensing the hydrolyzable silicon compound using one or more compounds selected from inorganic acids and sulfonic acid derivatives as an acid catalyst to yield a reaction mixture and substantially removing the acid catalyst from the reaction mixture.

3. The thermosetting silicon-containing intermediate-film-forming composition according to claim 1, wherein M in the above general formula (2) is tertiary sulfonium, secondary iodonium or quaternary ammonium.

4. The thermosetting silicon-containing intermediate-film-forming composition according to claim 2, wherein M in the above general formula (2) is tertiary sulfonium, secondary iodonium or quaternary ammonium.

5. The thermosetting silicon-containing intermediate-film-forming composition according to claim 1, wherein M in the above general formula (2) is photodegradable.

6. The thermosetting silicon-containing intermediate-film-forming composition according to claim 2, wherein M in the above general formula (2) is photodegradable.

7. The thermosetting silicon-containing intermediate-film-forming composition according to claim 3, wherein M in the above general formula (2) is photodegradable.

8. The thermosetting silicon-containing intermediate-film-forming composition according to claim 4, wherein M in the above general formula (2) is photodegradable.

9. The thermosetting silicon-containing intermediate-film-forming composition according to claim 1, wherein the hydrolyzable silicon compound has a light absorbable group.

10. The thermosetting silicon-containing intermediate-film-forming composition according to claim 8, wherein the hydrolyzable silicon compound has a light absorbable group.

11. The thermosetting silicon-containing intermediate-film-forming composition according to claim 1, wherein the thermosetting silicon-containing intermediate-film-forming composition further comprises water.

12. The thermosetting silicon-containing intermediate-film-forming composition according to claim 10, wherein the thermosetting silicon-containing intermediate-film-forming composition further comprises water.

13. The thermosetting silicon-containing intermediate-film-forming composition according to claim 1, wherein the thermosetting silicon-containing intermediate-film-forming composition further comprises a photo acid generator.

14. The thermosetting silicon-containing intermediate-film-forming composition according to claim 12, wherein the thermosetting silicon-containing intermediate-film-forming composition further comprises a photo acid generator.

15. The thermosetting silicon-containing intermediate-film-forming composition according to claim 1, wherein the thermosetting silicon-containing intermediate-film-forming composition further comprises a monovalent or polyvalent alcohol having a cyclic ether as a substituent.

16. The thermosetting silicon-containing intermediate-film-forming composition according to claim 14, wherein the thermosetting silicon-containing intermediate-film-forming composition further comprises a monovalent or polyvalent alcohol having a cyclic ether as a substituent.

17. A substrate comprising an organic film formed on a processing substrate, a silicon-containing film formed from a thermosetting silicon-containing film-forming composition, and a photoresist film formed on the silicon-containing film, wherein the thermosetting silicon-containing film-forming composition comprises:

(A) a silicon-containing compound obtained by hydrolyzing and condensing a hydrolyzable silicon compound using an acid as a catalyst;

(B) one or more thermal crosslinking accelerators represented by the following general formula (1) or (2):

$$L_a H_b X \quad (1),$$

wherein L represents lithium, sodium, potassium, rubidium or cesium, X represents a hydroxyl group or a monovalent or polyvalent organic acid group having 1 to 30 carbon atoms, a represents an integer of 1 or more, b represents an integer of 0 or 1 or more, and a+b is a valence of the hydroxyl group or the organic acid group;

$$M_{a'} H_{b'} A \quad (2),$$

wherein M represents sulfonium, iodonium or ammonium, A represents a hydroxyl group or a monovalent or polyvalent organic acid group having 1 to 30 carbon atoms or non-nucleophilic counter ion, a' represents an integer of 1 or more, b' represents an integer of 0 or 1 or more, and a'+b' is a valence of the hydroxyl group, the organic acid group or the non-nucleophilic counter ion;

(C) a monovalent or polyvalent organic acid having 1 to 30 carbon atoms;

(D) an alcohol having a formula selected from the following group:

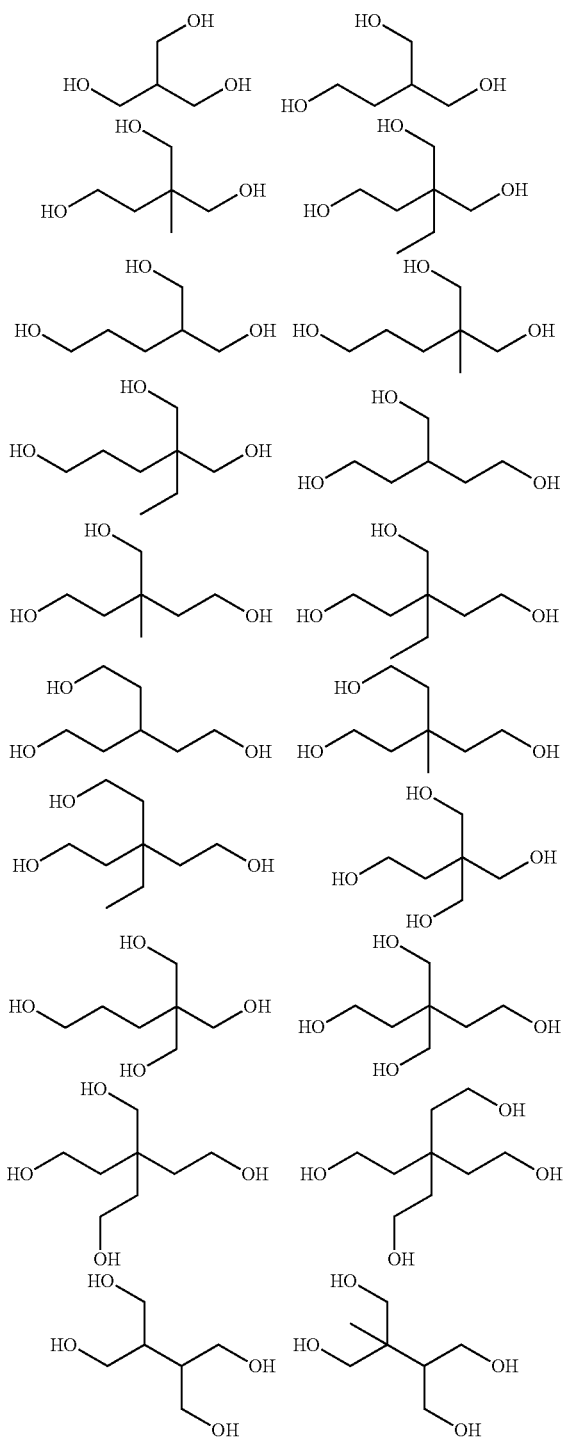
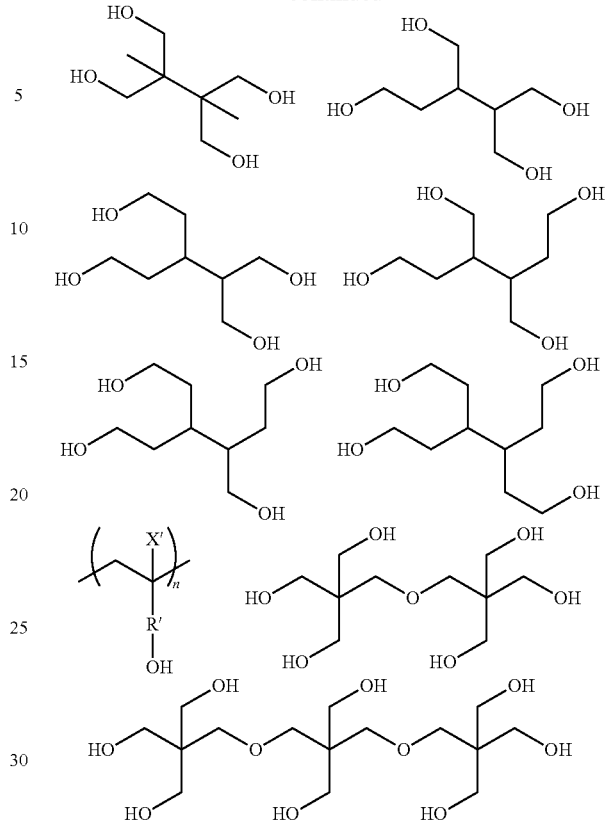

where:
X' represents a hydrogen or a methyl;
R' represents an organic group having one or more carbon atoms and having methylene as the carbon at the hydroxyl group side; and
n represents an integer of at least 3 and less than 100; and
(E) an organic solvent.

18. The substrate according to claim 17, wherein the thermosetting silicon-containing film-forming composition further comprises a monovalent or polyvalent alcohol having a cyclic ether as a substituent.

19. The substrate according to claim 17, further comprising an organic antireflection film between the silicon-containing film and the photoresist film.

20. The substrate according to claim 18, further comprising an organic antireflection film between the silicon-containing film and the photoresist film.

21. The substrate according to claim 17, wherein the photoresist film is formed using a chemically amplified type resist composition.

22. The substrate according to claim 20, wherein the photoresist film is formed using a chemically amplified type resist composition.

23. The substrate according to claim 17, wherein the organic film has an aromatic skeleton.

24. The substrate according to claim 22, wherein the organic film has an aromatic skeleton.

* * * * *